United States Patent
Kim et al.

(10) Patent No.: US 9,257,166 B2
(45) Date of Patent: Feb. 9, 2016

(54) CURRENT SENSE AMPLIFYING CIRCUIT IN SEMICONDUCTOR MEMORY DEVICE

(71) Applicants: Chankyung Kim, Hwaseong-si (KR); Dong-Seok Kang, Seoul (KR); Yunsang Lee, Yongin-si (KR); Soo-Ho Cha, Seoul (KR)

(72) Inventors: Chankyung Kim, Hwaseong-si (KR); Dong-Seok Kang, Seoul (KR); Yunsang Lee, Yongin-si (KR); Soo-Ho Cha, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/311,824

(22) Filed: Jun. 23, 2014

(65) Prior Publication Data

US 2015/0036421 A1    Feb. 5, 2015

(30) Foreign Application Priority Data

Jul. 30, 2013   (KR) .................. 10-2013-0090279

(51) Int. Cl.
| | | |
|---|---|---|
| G11C 11/00 | (2006.01) | |
| G11C 11/16 | (2006.01) | |
| G11C 5/02 | (2006.01) | |
| G11C 7/06 | (2006.01) | |
| G11C 7/14 | (2006.01) | |

(52) U.S. Cl.
CPC ............ *G11C 11/1673* (2013.01); *G11C 5/025* (2013.01); *G11C 7/06* (2013.01); *G11C 7/14* (2013.01)

(58) Field of Classification Search
CPC ..... G11C 11/4091; G11C 7/065; G11C 11/16; G11C 11/15
USPC .......................... 365/158, 205, 207
See application file for complete search history.

(56) References Cited

U.S. PATENT DOCUMENTS

| | | | |
|---|---|---|---|
| 7,016,220 | B2 | 3/2006 | Lee et al. |
| 7,184,342 | B2 | 2/2007 | Seo |
| 7,952,916 | B2 | 5/2011 | Maeda et al. |
| 8,102,695 | B2 | 1/2012 | Ono et al. |
| 8,154,903 | B2 | 4/2012 | Jung et al. |
| 8,194,439 | B2 | 6/2012 | Kim et al. |
| 8,243,504 | B2 | 8/2012 | Kang et al. |
| 8,335,101 | B2 | 12/2012 | Jung et al. |
| 2010/0142276 | A1* | 6/2010 | Kasuga .................. 365/185.11 |
| 2012/0051127 | A1* | 3/2012 | Yoon et al. .................. 365/163 |

FOREIGN PATENT DOCUMENTS

| | | |
|---|---|---|
| JP | 2008-135119 A | 6/2008 |
| KR | 20120076831 A | 7/2012 |
| KR | 20120091583 A | 8/2012 |

* cited by examiner

*Primary Examiner* — Huan Hoang
(74) *Attorney, Agent, or Firm* — Harness, Dickey & Pierce, P.L.C.

(57) ABSTRACT

Disclosed is a current sense amplifier suitable for a nonvolatile memory device such as a magnetic random access memory. In the current sense amplifier, a reference memory cell for sensing is implemented by a memory cell equal to a normal memory cell without fabricating different reference memory cells. The current sense amplifier is formed of first and second cross coupled differential amplifiers being covalent bonded. The current sense amplifier compares a current flowing to a sensing node of a memory cell directly with currents flowing to reference sensing nodes.

19 Claims, 18 Drawing Sheets

CURRENT SENSE AMPLIFYING CIRCUIT IN SEMICONDUCTOR MEMORY DEVICE

CROSS-REFERENCE TO RELATED APPLICATIONS

A claim for priority under 35 U.S.C. §119 is made to Korean Patent Application No. 10-2013-0090279 filed Jul. 30, 2013, in the Korean Intellectual Property Office, the entire contents of which are hereby incorporated by reference.

BACKGROUND

Inventive concepts described herein relate to a semiconductor memory device such as a current sense amplifying circuit suitable for a nonvolatile semiconductor memory device such as a resistive memory.

Semiconductor memory devices are widely used for electronic systems that store data. The semiconductor memory devices are divided into nonvolatile semiconductor memory devices and volatile semiconductor memory devices. The volatile semiconductor memory devices such as an SRAM, a DRAM, etc. lose their data when a power is interrupted.

In contrast, the nonvolatile semiconductor memory devices such as an EEPROM, a magnetic RAM (MRAM), etc., retain their data even when a power is interrupted. Thus, the nonvolatile semiconductor memory devices are mainly used to retain data regardless of power fail or power interruption.

In a semiconductor memory field, there are a variety of techniques to increase an integration level, increase operation speed, and performance such as securing of data reliability. Performance is lowered by various causes such as variation in process of a semiconductor memory device, variations in signals provided to various circuits (e.g., data routing, circuit for reading, etc.) for operating the semiconductor memory device, etc.

SUMMARY

At least one example embodiment of inventive concepts is directed to a current sense amplifier circuit of a semiconductor memory device which comprises a first cross coupled differential amplifier connected to a first sensing and to a second sensing node, the first sensing node connected to a first reference resistor and the second sensing node connected to a memory cell, the first cross coupled differential amplifier configured to output a first sensing voltage to a first output terminal and a second cross coupled differential amplifier connected to the second sensing node and to a third sensing node, the third sensing node connected to a second reference resistor different from the first reference resistor, wherein the second cross coupled differential amplifier and the first cross coupled differential amplifier are commonly connected to the second sensing node, the first and second cross coupled differential amplifiers cooperatively configured to output a second sensing voltage to a second output terminal, the first and second sensing voltages being differential, and wherein the second cross coupled differential amplifier is configured to output a third sensing voltage equal to the first sensing voltage to a third output terminal.

In an example embodiment, the first and second cross coupled differential amplifiers include PMOS transistors and NMOS transistors.

In an example embodiment, the first and second cross coupled differential amplifiers include PMOS transistors having the same size and NMOS transistors having the same size.

In an example embodiment, first and second reference cells include the first and second reference resistors, respectively, and the first and second reference cells are a same type as the memory cell.

In an example embodiment, the first reference resistor has a first resistance value corresponding to the memory cell having a first resistance state and the second reference resistor has a second resistance value corresponding to the memory cell having a second resistance state, the second resistance state different from the first resistance state.

In an example embodiment, the current sense amplifier circuit is configured to generate a sensing reference current based on determining a current flowing to the second sensing node and currents flowing to the first and third sensing nodes without a current mirroring operation.

In an example embodiment, the memory cell is an STT-MRAM cell including an access transistor and an MTJ element.

Another example embodiment of inventive concepts is directed to a current sense amplifier circuit of a semiconductor memory device which comprises a first cross coupled differential amplifier including a first PMOS transistor having a source connected to a power supply voltage source, a gate connected to a first output terminal and a drain connected to a second output terminal, a first NMOS transistor having a gate connected to the first output terminal, a drain connected to the second output terminal, and a source connected to a second sensing node connected to a memory cell, a second PMOS transistor having a source connected to the power supply voltage source, a gate connected to the second output terminal, and a drain connected to the first output terminal, and a second NMOS transistor having a gate connected to the second output terminal, a drain connected to the first output terminal, and a source connected to a first sensing node connected to a first reference resistor, the first cross coupled differential amplifier configured to output a first sensing voltage to the first output terminal and a second cross coupled differential amplifier including a third PMOS transistor having a source connected to the power supply voltage source, a gate connected to a third output terminal, and a drain connected to the second output terminal, a third NMOS transistor having a gate connected to the third output terminal, a drain connected to the second output terminal, and a source connected to the second sensing node, a fourth PMOS transistor having a source connected to the power supply voltage, a gate connected to the second output terminal, and a drain connected to the third output terminal, and a fourth NMOS transistor having a gate connected to the second output terminal, a drain connected to the third output terminal, and a source connected to a third sensing node connected to a second reference resistor, the second reference resistor different from the first reference resistor, wherein the second cross coupled differential amplifier and the first cross coupled differential amplifier are commonly connected to the second sensing node, the first and second cross coupled differential amplifiers cooperatively configured to output a second sensing voltage, the first and second sensing voltages being differential, and wherein the second cross coupled differential amplifier is configured to output a third sensing voltage equal to the first sensing voltage to the third output terminal.

In an example embodiment, the first to fourth PMOS transistors have a same gate width.

In an example embodiment, the first to fourth NMOS transistors have a same gate width.

In an example embodiment, the current sense amplifier circuit is configured to generate a sensing reference current based on determining a current flowing to the second sensing node and currents flowing to the first and third sensing nodes without a current mirroring operation.

In an example embodiment, first and second reference cells include the first and second reference resistors, respectively, and the first and second reference cells are a same type as the memory cell.

In an example embodiment, the first reference resistor has a first resistance value corresponding to the memory cell storing data '1' and the second reference resistor has a second resistance value corresponding to the memory cell storing data '0'.

In an example embodiment, the first reference resistor has a first resistance value corresponding to the memory cell storing data '0' and the second reference resistor has a second resistance value corresponding to the memory cell storing data '1'.

In an example embodiment, the first cross coupled differential amplifier further includes a fifth PMOS transistor having a source connected to the power supply voltage source, a gate connected to the second output terminal, and a drain connected to the first output terminal, and a fifth NMOS transistor having a drain connected to the first output terminal, a gate connected to the second output terminal, and a source connected to the first sensing node, and the second cross coupled differential amplifier further includes a sixth PMOS transistor having a source connected to the power supply voltage source, a gate connected to the second output terminal, and a drain connected to the third output terminal, and a sixth NMOS transistor having a drain connected to the third output terminal, a gate connected to the second output terminal, and a source connected to the third sensing node.

Still another example embodiment of inventive concepts is directed to a current sense amplifier circuit of a semiconductor memory device which comprises a first cross coupled differential amplifier including a first PMOS transistor having a source connected to a second sensing node connected to a memory cell, a gate connected to a first output terminal and a drain connected to a second output terminal, a first NMOS transistor having a gate connected to the first output terminal, a drain connected to the second output terminal, and a source connected to a ground voltage source, a second PMOS transistor having a source connected to a first sensing node connected to a first reference resistor, a gate connected to the second output terminal, and a drain connected to the first output terminal, and a second NMOS transistor having a gate connected to the second output terminal, a drain connected to the first output terminal, and a source connected to the ground voltage source, the first cross coupled differential amplifier configured to output a first sensing voltage to the first output terminal, and a second cross coupled differential amplifier including a third PMOS transistor having a source connected to a second sensing node, a gate connected to a third output terminal, and a drain connected to the second output terminal, a third NMOS transistor having a gate connected to the third output terminal, a drain connected to the second output terminal, and a source connected to the ground voltage source, a fourth PMOS transistor having a source connected to a third sensing node connected to a second reference resistor different from the first reference resistor, a gate connected to the second output terminal, and a drain connected to the third output terminal and a fourth NMOS transistor having a gate connected to the second output terminal, a drain connected to the third output terminal, and a source connected to the ground voltage source, wherein the second cross coupled differential amplifier participates in an operation, in which the second sensing voltage is output to the second output terminal by using the second sensing node as a shared current branch, together with the first cross coupled differential amplifier, and wherein the second cross coupled differential amplifier is configured to output a third sensing voltage equal to the first sensing voltage to the third output terminal.

In an example embodiment, the first cross coupled differential amplifier further includes a fifth PMOS transistor having a source connected to the first sensing node, a gate connected to the second output terminal, and a drain connected to the first output terminal, and a fifth NMOS transistor having a drain connected to the first output terminal, a gate connected to the second output terminal, and a source connected to the ground voltage source, and the second cross coupled differential amplifier further includes a sixth PMOS transistor having a source connected to the third sensing node, a gate connected to the second output terminal, and a drain connected to the third output terminal, and a sixth NMOS transistor having a drain connected to the third output terminal, a gate connected to the second output terminal, and a source connected to the ground voltage source.

In an example embodiment, a clamping transistor is configured to receive a current flowing through the memory cell to the second sensing node.

In an example embodiment, a sensing selection transistor is configured to receive a current flowing through the memory cell to the second sensing node.

In an example embodiment, the current sense amplifier circuit is configured to generate a sensing reference current based on determining a current flowing to the second sensing node and currents flowing to the first and third sensing nodes without a current mirroring operation.

In an example embodiment, first and second reference cells include the first and second reference resistors, respectively, and the first and second reference cells are a same type as the memory cell.

In an example embodiment, the first reference resistor has a first resistance value corresponding to the memory cell storing data '1' and the second reference resistor has a second resistance value corresponding to the memory cell storing data '0'.

In an example embodiment, the memory cell is a PRAM cell.

Another example embodiment of inventive concepts is directed to a nonvolatile memory device comprising a memory cell array including magnetic memory cells and first and second reference memory cells, the first and second reference cells including first and second reference resistors, respectively, and a read and write circuit including a sense amplifier circuit configured to sensing data stored in the magnetic memory cells. The sense amplifier circuit includes a current sense amplifier circuit including a first cross coupled differential amplifier and to a second sensing node, the first sensing node connected to the first reference resistor and the second sensing node connected to a selected magnetic memory cell, the first cross coupled differential amplifier configured to output a first sensing voltage to first output terminal, and a second cross coupled differential amplifier connected to the second sensing node and to a third sensing node, the third sensing node connected to the second reference resistor formed of the second reference memory cell. The second cross coupled differential amplifier and the first cross coupled differential amplifier are commonly connected to the second sensing node, the first and second cross coupled differential amplifiers cooperatively configured to output a second sensing voltage, the first and second sensing voltages being differential. The second cross coupled differential amplifier is configured to output a third sensing voltage equal to the first sensing voltage to a third output terminal.

In an example embodiment, a resistance value of the first reference memory cell is equal to a resistance value of the selected magnetic memory cell having a first resistance state.

In an example embodiment, a resistance value of the second reference memory cell is equal to a resistance value of the selected magnetic memory cell having a second resistance state.

In an example embodiment, the first resistance state of the selected magnetic memory cell corresponds to data '1'.

In an example embodiment, the second resistance state of the selected magnetic memory cell corresponds to data '0'.

In an example embodiment, the selected magnetic memory cell and the first and second reference memory cells each include an STT-MRAM cell, the first reference memory cell has a high resistance state, and the second reference memory cell has a low resistance state.

At least one example embodiment discloses a nonvolatile memory device including a current sense amplifier coupled to a memory cell, the memory cell coupled to a sensing node, the current sense amplifier including, a first cross coupled differential amplifier coupled to a first reference cell, and a second cross coupled differential amplifier coupled to a second reference cell, the first and second cross coupled differential amplifiers being coupled in common to the sensing node, the current sense amplifier configured to determine a state of the memory cell based on states of the first and second reference cells, respectively.

In an example embodiment, the current sense amplifier is configured to determine the state of the memory cell without current mirroring.

In an example embodiment, the first reference cell has a first resistance and the second reference cell has a second resistance, the first and second resistances being different.

In an example embodiment, the first resistance represents a first state and the second resistance represents a second state, the memory cell having one of the first and second states.

In an example embodiment, the first and second cross coupled differential amplifiers are covalently bonded.

In an example embodiment, the first reference cell, the second reference cell and the memory cell are a same type.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
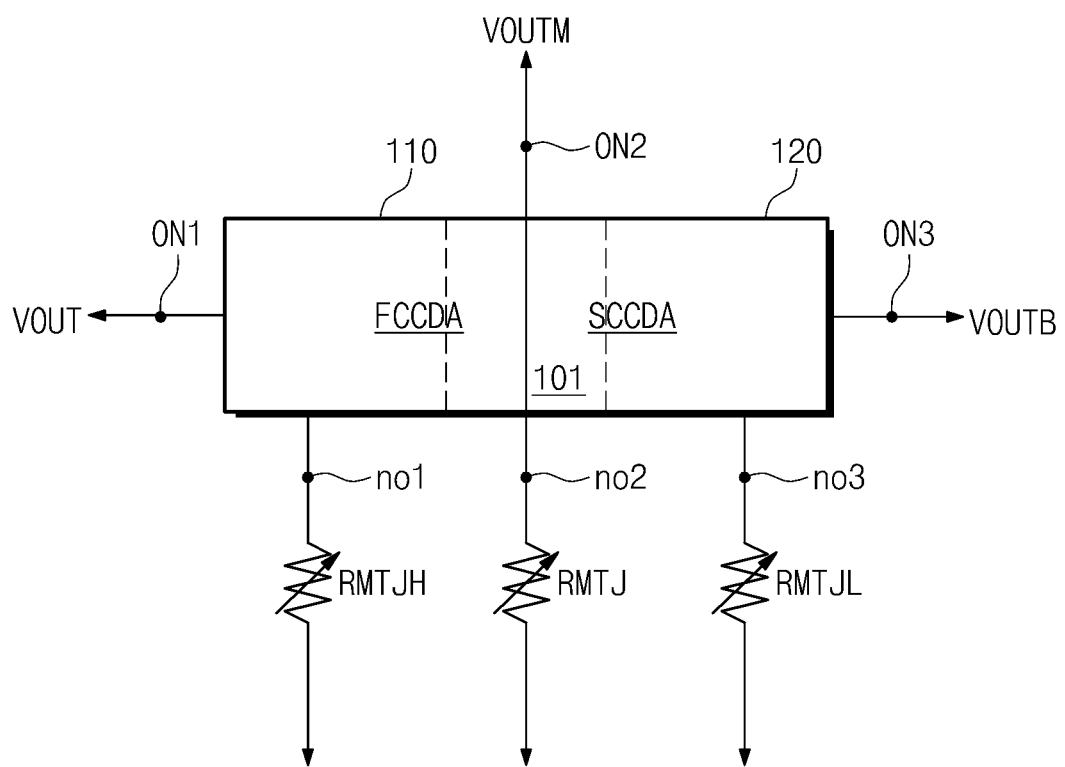
FIG. 1 is a block diagram schematically illustrating a current sense amplifier circuit of a semiconductor memory device according to an example embodiment of inventive concepts.

Example embodiments will be described in detail with reference to the accompanying drawings. Inventive concepts, however, may be embodied in various different forms, and should not be construed as being limited only to the illustrated embodiments. Rather, example embodiments are provided as examples so that this disclosure will be thorough and complete, and will fully convey the concept of inventive concepts to those skilled in the art. Accordingly, known processes, elements, and techniques are not described with respect to some example embodiments of inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Note that details of data access operations associated with an MRAM, internal function circuits and a differential amplifier for a current sense amplifier may be skipped to prevent inventive concepts from becoming ambiguous.

FIG. 1 is a block diagram schematically illustrating a current sense amplifier circuit of a semiconductor memory device according to an example embodiment of inventive concepts.

A current sense amplifier circuit 101 of a semiconductor memory device includes a first cross coupled differential amplifier (FCCDA) 110 and a second cross coupled differential amplifier (SCCDA) 120. The first and second cross coupled differential amplifiers 110 and 120 are connected in common to a second sensing node no2 to have a covalent bonded structure. Here, 'FCCDA' means initials of First Cross Coupled Differential Amplifier, and 'SCCDA' means initials of Second Cross Coupled Differential Amplifier.

The first cross coupled differential amplifier 110 is connected to a first sensing node no1 connected to a first reference resistor RMTJH and a second sensing node no2 connected to a cell resistor RMTJ of a memory cell, and outputs first and second sensing voltages VOUT and VOUTM, being differential to each other, to first and second output nodes ON1 and ON2.

The second cross coupled differential amplifier 120 is connected to the second node no2 and a third sensing node no3 connected to a second reference resistor RMTJL different from the first reference resistor RMTJH. By using the second sensing node no2 as a shared current branch, the second cross coupled differential amplifier 120 participates in an operation where the second sensing voltage VOUTM is output to the second output node ON2, together with the first cross coupled differential amplifier 110, and outputs a third sensing voltage VOUTB, which is equal to the first sensing voltage VOUT of the first output node ON1, to the third output node ON3.

The first and second reference resistors RMTJH and RMTJL are implemented by a same type of cell as a memory cell (formed of an MTJ element). That is, a normal memory cell is used as a reference cell for sensing data without fabrication of a separate reference memory cell. Here, a resistance value of the first reference resistor RMTJH is equal to that when a memory cell has a first resistance state (e.g., high). A resistance value of the second reference resistor RMTJL is equal to that when a memory cell has a second resistance state (e.g., low) different from the first resistance state.

The current sense amplifier circuit 101 compares a current flowing into the second sensing node no2 directly with a current flowing into the first and second sensing nodes no1 and no3 without a current mirroring operation for generation of a sensing reference current.

In case of an MRAM, a memory cell expressed by the cell resistor RMTJ may be an STT-MRAM cell formed of an access transistor and an MTJ element.

Figure 2:
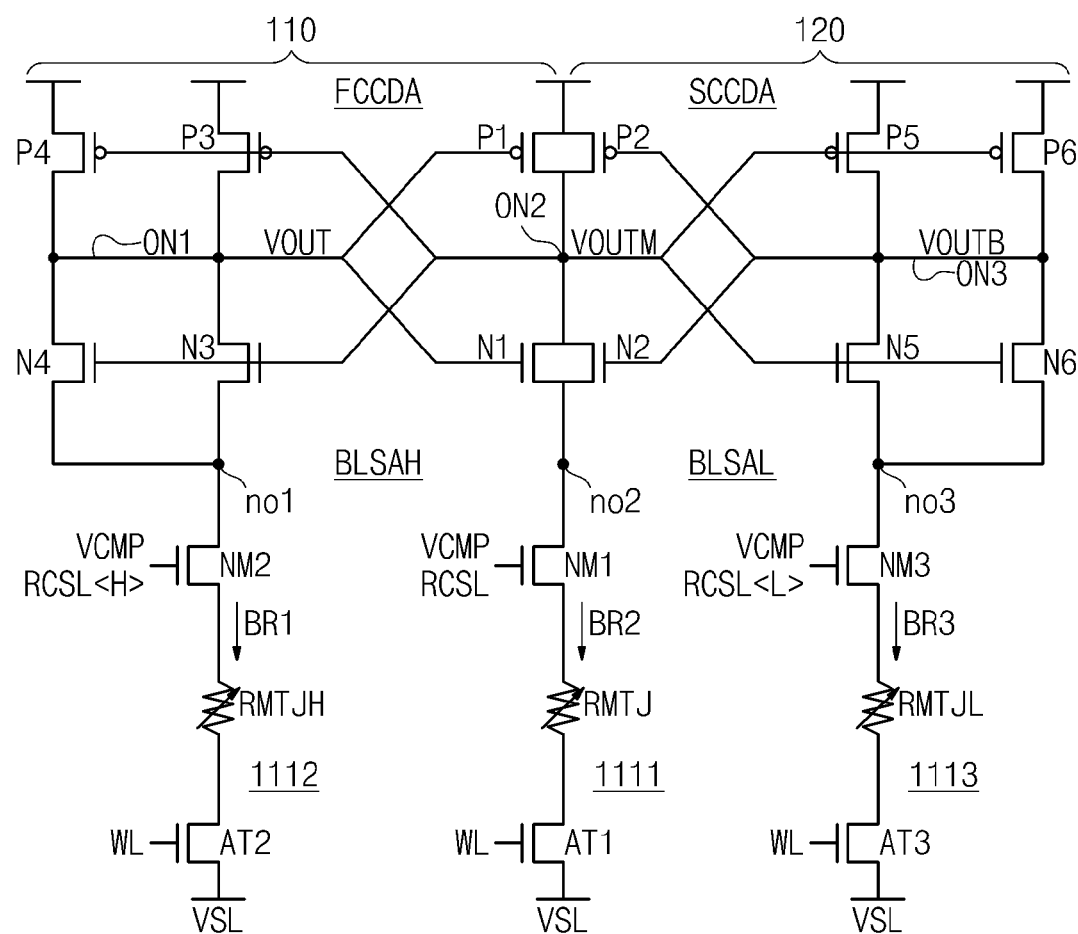
FIG. 2 is a circuit diagram of a current sense amplifier circuit shown in FIG. 1, according to an example embodiment of inventive concepts.

FIG. 2 is a circuit diagram of a current sense amplifier circuit shown in FIG. 1, according to an example embodiment of inventive concepts.

Referring to FIG. 2, a current sense amplifier circuit 101 includes a first cross coupled differential amplifier 110 and a second cross coupled differential amplifier 120.

The first cross coupled differential amplifier 110 includes a first PMOS transistor P1 having a source connected to a power supply voltage, a gate connected to a first output node ON1, and a drain connected to a second output node ON2; a first NMOS transistor N1 having a gate connected to the first output node ON1, a drain connected to the second output node ON2, and a source connected to the second sensing node NO2 connected to a memory cell; a second PMOS transistor P3 having a source connected to the power supply voltage, a gate connected to the second output node ON2, and a drain connected to the first output node ON1; and a second NMOS transistor N3 having a gate connected to the second output node ON2, a drain connected to the first output node ON1, and a source connected to the first sensing node no1 connected to a first reference resistor.

The first cross coupled differential amplifier 110 is configured to output first and second sensing voltages VOUT and VOUTM to the first and second output nodes ON1 and ON2, respectively. Here, the first and second sensing voltages VOUT and VOUTM are differential each other.

A differential amplification operation of the cross coupled differential amplifier is well known in this art, and a detailed description of a transistor level is omitted.

The second cross coupled differential amplifier 120 includes a third PMOS transistor P2 having a source connected to the power supply voltage, a gate connected to a third output node ON3, and a drain connected to the second output node ON2; a third NMOS transistor N2 having a gate connected to the third output node ON3, a drain connected to the second output node ON2, and a source connected to the second sensing node; a fourth PMOS transistor P5 having a source connected to the power supply voltage, a gate connected to the second output node ON2, and a drain connected to the third output node ON3; and a fourth NMOS transistor N5 having a gate connected to the second output node ON2, a drain connected to the third output node ON3, and a source connected to the third sensing node no3 connected to a second reference resistor different from the first reference resistor.

By using the second sensing node no2 as a shared current branch, the second cross coupled differential amplifier 120 participates in an operation where the second sensing voltage VOUTM is output to the second output node ON2, together with the first cross coupled differential amplifier 110, and outputs a third sensing voltage VOUTB, which is equal to the first sensing voltage VOUT of the first output node ON1, to the third output node ON3.

To improve a sensing margin, the first cross coupled differential amplifier 110 further comprises a fifth PMOS transistor P4 having a source connected to the power supply voltage, a gate connected to the second output node ON2, and a drain connected to the first output node ON1; and a fifth NMOS transistor N4 having a drain connected to the first output node ON1, a gate connected to the second output node ON2, and a source connected to the first sensing node no1.

Also, the second cross coupled differential amplifier 120 further comprises a sixth PMOS transistor P6 having a source connected to the power supply voltage, a gate connected to the second output node ON2, and a drain connected to the third output node ON3; and a sixth NMOS transistor N6 having a drain connected to the third output node ON3, a gate connected to the second output node ON2, and a source connected to the third sensing node no3.

The fifth and sixth PMOS transistors P4 and P6 and the fifth and sixth NMOS transistors N4 and N6 function as dummy transistors that are used to improve a sensing margin and a sensing speed.

The PMOS transistors P1 to P6 of the current sense amplifier circuit 101 show in FIG. 2 have the same size, for example, the same gate width. Also, the NMOS transistors N1 to N6 of the current sense amplifier circuit 101 show in FIG. 2 have the same size, for example, the same gate width.

In case of a magnetic memory cell, a memory cell 1111 shown in FIG. 2 is formed of an MTJ element and an access transistor AT1. In FIG. 2, the MTJ element of the memory cell 1111 is expressed by a variable resistor RMTJ that has a high resistance state or a low resistance state according to a data storage state.

A first reference cell 1112 forming a first reference resistor includes an MTJ element and an access transistor AT2. In FIG. 2, the MTJ element of the first reference cell 1112 is expressed by a variable resistor RMTJH that has a high resistance state.

A second reference cell 1113 forming a second reference resistor includes an MTJ element and an access transistor AT3. In FIG. 2, the MTJ element of the second reference cell 1113 is expressed by a variable resistor RMTJL that has a low resistance state.

NMOS transistors NM2, NM1 and NM3 respectively connected to the first to third sensing nodes not, no2 and no3 function as selection transistors for selecting a current branch. Also, the NMOS transistors NM2, NM1 and NM3 function as clamping transistors for adjusting the amount of current flowing through current branches BR1, BR2 and BR3.

For example, when a selection signal RCSL for selecting a memory cell connected to the current branch BR2 has a high level, the NMOS transistor NM1 is turned on to form a current path of the current branch BR2. Also, a turn-on degree of the NMOS transistor NM1 is controlled by a clamping voltage level of a clamping signal VCMP for clamping a current of the current branch BR2 such that a current flowing through the current branch BR2 is clamped within a predetermined range.

Figure 3:
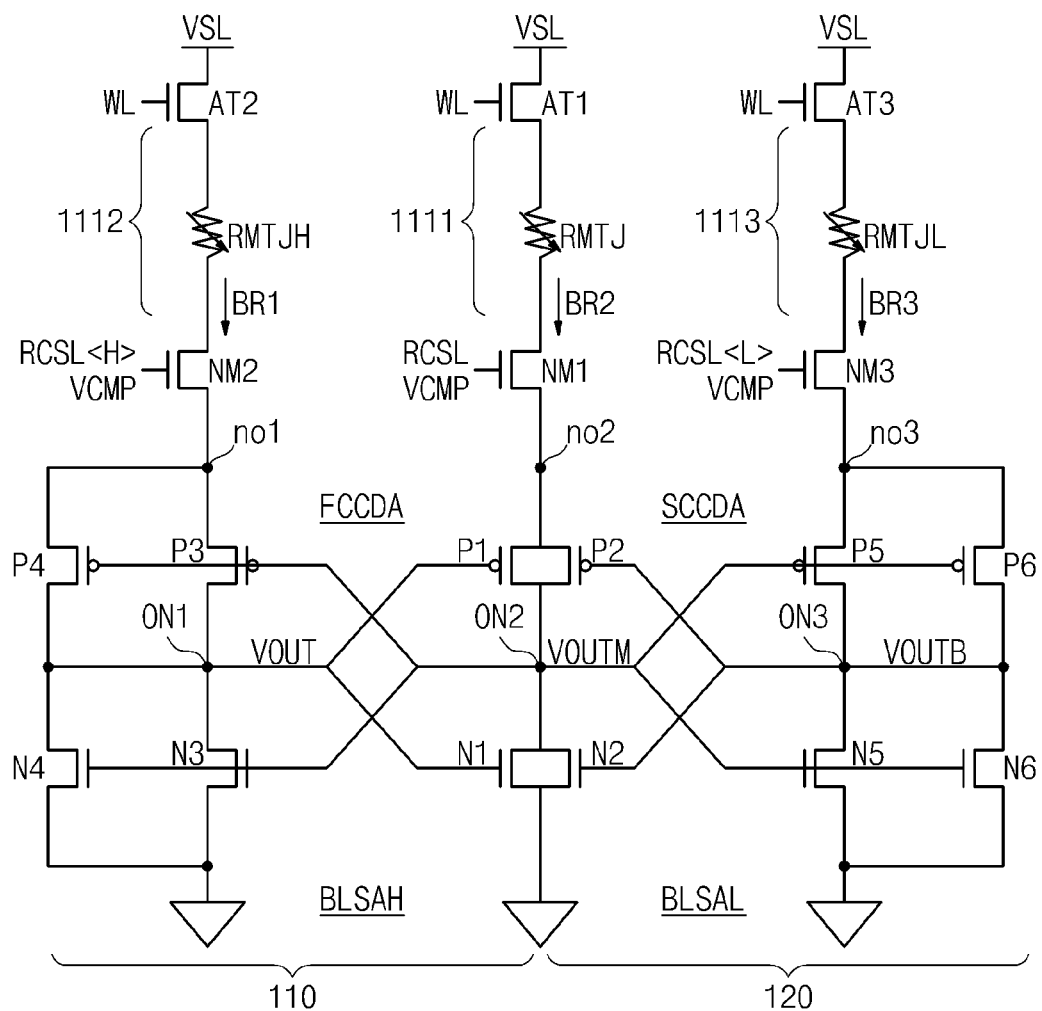
FIG. 3 is a detailed circuit diagram of a current sense amplifier circuit shown in FIG. 1, according to another example embodiment of inventive concepts.

FIG. 3 is a detailed circuit diagram of a current sense amplifier circuit shown in FIG. 1, according to another example embodiment of inventive concepts.

The first cross coupled differential amplifier 110 includes a first PMOS transistor P1 having a source connected to a second sensing node no2 connected to a memory cell, a gate connected to a first output node ON1, and a drain connected to a second output node ON2; a first NMOS transistor N1 having a gate connected to the first output node ON1, a drain connected to the second output node ON2, and a source grounded; a second PMOS transistor P3 having a source connected to a first sensing node no1 connected to a first reference resistor, a gate connected to the second output node ON2, and a drain connected to the first output node ON1; and a second NMOS transistor N3 having a gate connected to the second output node ON2, a drain connected to the first output node ON1, and a source grounded.

The first cross coupled differential amplifier 110 is configured to output first and second sensing voltages VOUT and VOUTM to the first and second output nodes ON1 and ON2, respectively. Here, the first and second sensing voltages VOUT and VOUTM are differential each other.

The second cross coupled differential amplifier 120 includes a third PMOS transistor P2 having a source connected to the second sensing node no2, a gate connected to a third output node ON3, and a drain connected to the second output node ON2; a third NMOS transistor N2 having a gate connected to the third output node ON3, a drain connected to the second output node ON2, and a source grounded; a fourth PMOS transistor P5 having a source connected to a third sensing node no3 connected to a second reference resistor RMTJL different from the first reference resistor, a gate connected to the second output node ON2, and a drain connected to the third output node ON3; and a fourth NMOS transistor N5 having a gate connected to the second output node ON2, a drain connected to the third output node ON3, and a source grounded.

By using the second sensing node no2 as a shared current branch, the second cross coupled differential amplifier 120 participates in an operation where the second sensing voltage VOUTM is output to the second output node ON2, together with the first cross coupled differential amplifier 110, and outputs a third sensing voltage VOUTB, which is equal to the first sensing voltage VOUT of the first output node ON1, to the third output node ON3.

The first cross coupled differential amplifier 110 further comprises a fifth PMOS transistor P4 having a source connected to the first sensing node no1, a gate connected to the second output node ON2, and a drain connected to the first output node ON1; and a fifth NMOS transistor N4 having a drain connected to the first output node ON1, a gate connected to the second output node ON2, and a source grounded. The fifth PMOS and NMOS transistors P4 and N4 function as dummy transistors that are used to improve a sensing margin.

Also, the second cross coupled differential amplifier 120 further comprises a sixth PMOS transistor P6 having a source connected to the third sensing node no3, a gate connected to the second output node ON2, and a drain connected to the third output node ON3; and a sixth NMOS transistor N6 having a drain connected to the third output node ON3, a gate connected to the second output node ON2, and a source grounded.

The sixth PMOS and NMOS transistors P6 and N6 function as dummy transistors that are used to improve a sensing margin.

FIG. 3 is a circuit diagram of a current sense amplifier circuit shown in FIG. 2, according to a modified example embodiment of inventive concepts. A circuit is disposed between first to third sensing nodes no1 to no3 and a ground voltage. A current sense amplifier circuit shown in FIG. 3 operates the substantially the same as that shown in FIG. 2.

Figure 4:
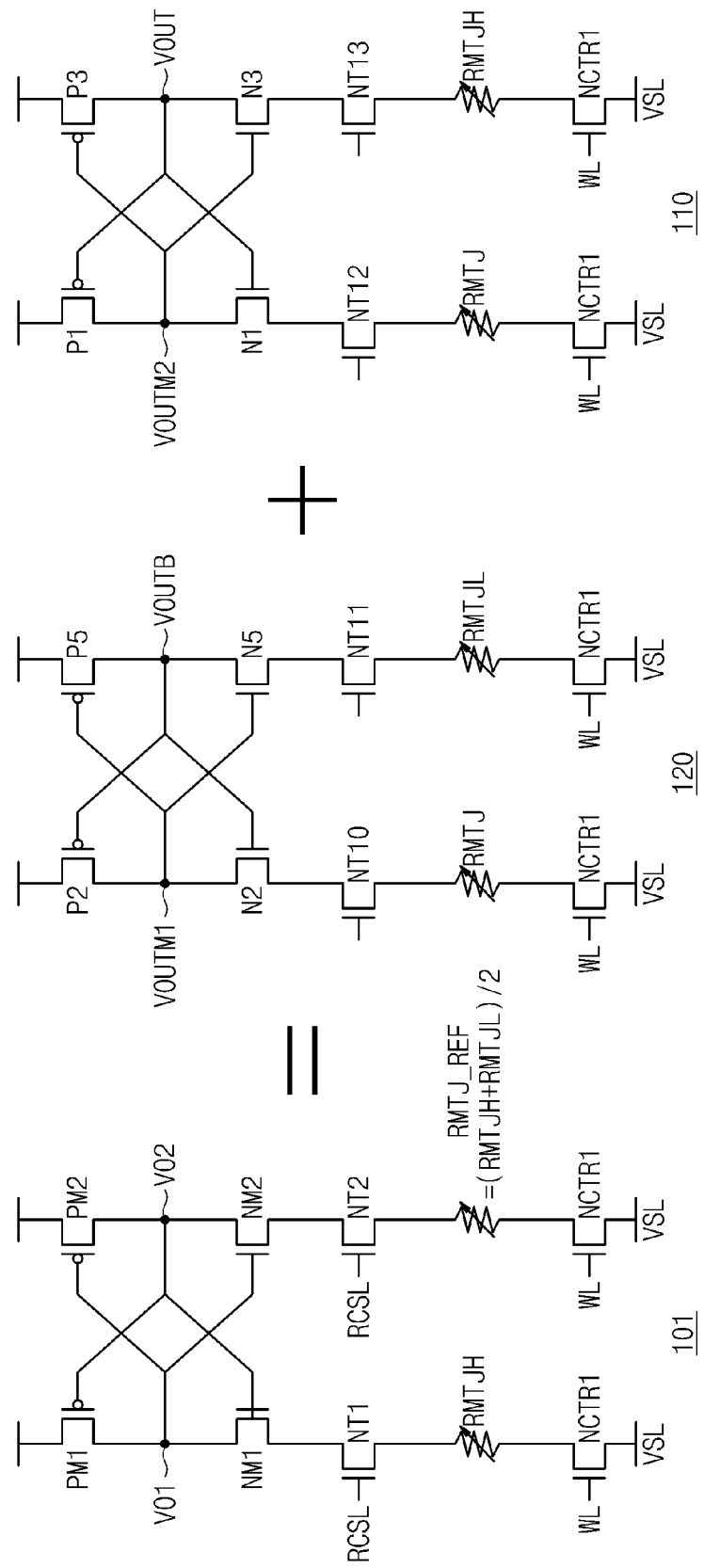
FIG. 4 is an equivalent circuit diagram for describing a conceptual principle on a current sense amplifier circuit shown in FIG. 2 or 3.

FIG. 4 is an equivalent circuit diagram for describing a conceptual principle on a current sense amplifier circuit shown in FIG. 2 or 3.

Referring to FIG. 4, a current sense amplifier circuit is formed of a cross coupled differential amplifier 101. However, it is difficult to fabricate a reference cell that has a one-half resistance value decided based on resistance values of a memory cell having a high resistance state and a memory cell having a low resistance state. In the event that a sensing margin is critical, incorrect implementation of the one-half resistance value of the reference cell causes a data sensing error.

According to an embodiment of the inventive concept, two cross coupled differential amplifiers are configured to have a covalent bonded structure. With this structure, it is possible to obtain the same effect as that achieved through a reference cell having the half of a resistance value being a sum of a resistance value of a memory cell having a high resistance state and a resistance value of a memory cell having a low resistance state.

That is, if a circuit shown in FIG. 2 or 3 is implemented by forming the first and second cross coupled differential amplifiers 110 and 120 by a covalent bonded structure, a current flowing into a sensing node of a memory cell is directly compared with a current flowing into reference sensing nodes without a current mirroring operation for generating a sensing reference current.

Also, a reference memory cell for sensing is implemented by the same memory cell as a normal memory cell without fabrication through a separate process.

Figure 5:
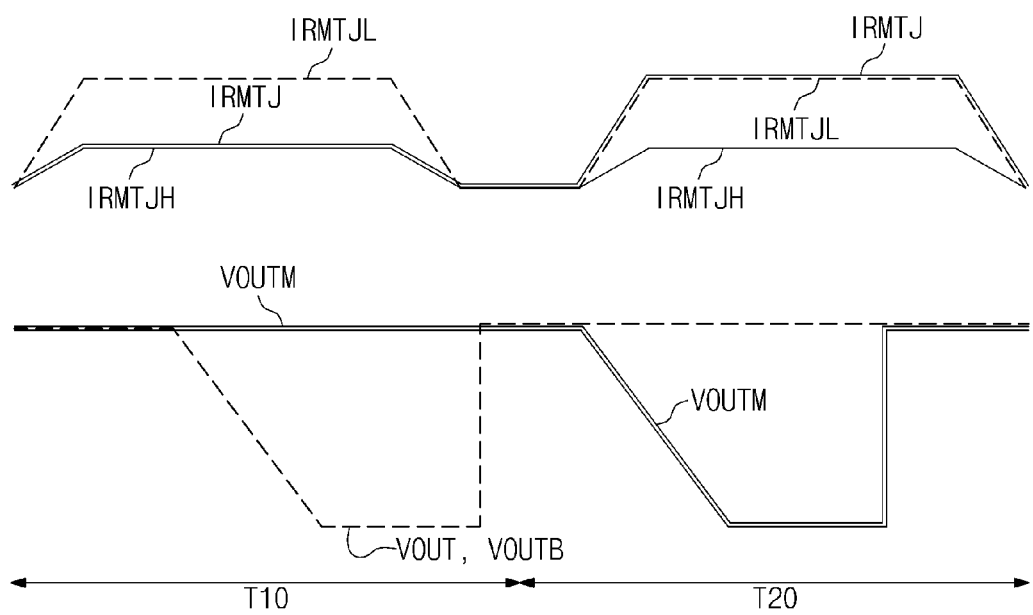
FIG. 5 is a timing diagram of a sensing operation according to FIG. 2.

FIG. 5 is a timing diagram of a sensing operation according to FIG. 2.

Below, an example sensing operation of FIG. 5 is described.

First, there is assumed that a resistor RMTJ of an MTJ element forming a memory cell 1111 shown in FIG. 2 has a low resistance state, for example, data 0. That is, it is assumed that data 0 is stored in the memory cell 1111 through a write operation.

In this case, NMOS transistors NM1 to NM3 are turned on.

Thus, as compared to such a case that the resistor RMTJ of the MTJ element has a high resistance state, for example, data 1, a relatively larger amount of current flows into a second current branch BR2 of a second sensing node no2.

At this time, the amount of current flowing into a third current branch BR3 of a third sensing node no3 is the same as or similar with the amount of current flowing into the second current branch BR2. The reason is that a resistance value of the resistor RMTJ is equal to that of a second reference resistor RMTJL.

Meanwhile, the amount of current flowing into a first current branch BR1 of a first sensing node no1 is less than the amount of current flowing into the second current branch BR2. The reason is that a resistance value of the first reference resistor RMTJH is equal to that of the resistor RMTJ having a high resistance state.

Thus, a current difference between the first current branch BR1 and the second current branch BR2 is larger than that between the second current branch BR2 and the third current branch BR3.

As a result, a first bit line sense amplifier BLSAH being the first cross coupled differential amplifier 110 is dominant in operation as compared to a second bit line sense amplifier BLSAL being the second cross coupled differential amplifier 120. In other words, the second bit line sense amplifier BLSAL is recessive in operation as compared to the first bit line sense amplifier BLSAH.

Thus, a PMOS transistor P1 is relatively slightly turned on as compared to a PMOS transistor P3, and an NMOS transistor N1 is relatively strongly turned on as compared to an NMOS transistor N3. An operation interval T20 in FIG. 5 shows a current variation when a memory cell has data 0. Current levels of IRMTJL and IRMTJ are larger than that of IRMTJH.

Therefore, a potential of a second output node ON2 gradually decreases to a low level, and a potential of a first output node ON1 is relatively higher than that of the second output node ON2. Meanwhile, a potential of a third output node ON3 has a high level like a potential of the first output node ON1.

As a result, a second sensing voltage VOUTM of the second output node ON2, as shown in the operation interval T20 of FIG. 5, is output as a low level (data 0), and first and third sensing voltages VOUT and VOUTB of the first and third output nodes ON1 and ON3 are output as a high level (data 1). An operation interval T20 in FIG. 5 shows current and voltage variations when a memory cell has data 0.

A sensing operation is performed as illustrated an interval T20 in FIG. 5. The reason is that by using the second sensing node no2 as a shared current branch, the second cross coupled differential amplifier 120 participates in an operation where the second sensing voltage VOUTM is output to the second output node ON2, together with the first cross coupled differential amplifier 110 and outputs a third sensing voltage VOUTB, which is equal to the first sensing voltage VOUT of the first output node ON1, to the third output node ON3.

As described above, a current sense amplifier circuit shown in FIG. 3 compares a current flowing into a sensing node of a memory cell directly with a current flowing into reference sensing nodes without a current mirroring operation for generation of a sensing reference current.

Also, a memory cell for sensing is implemented by the same memory cell as a normal memory cell without fabrication of a reference memory cell through a separate process.

Below, there is considered a case opposite to the above-described sensing operation.

That is, there is assumed that a resistor RMTJ of an MTJ element forming a memory cell 1111 shown in FIG. 2 has a high resistance state, for example, data 1. That is, it is assumed that data 1 is stored in the memory cell 1111 through a write operation. Likewise, NMOS transistors NM1 to NM3 are turned on.

Thus, as compared to such a case that the resistor RMTJ of the MTJ element has a low resistance state, for example, data 0, a relatively smaller amount of current flows into the second current branch BR2 of the second sensing node no2.

At this time, the amount of current flowing into the first current branch BR1 of the first sensing node no1 is the same as or similar with the amount of current flowing into the second current branch BR2. The reason is that a resistance value of the resistor RMTJ is equal to that of a first reference resistor RMTJH.

Meanwhile, the amount of current flowing into the third current branch BR3 of the third sensing node no3 is more than the amount of current flowing into the second current branch BR2. The reason is that a resistance value of the second reference resistor RMTJL is equal to that of the resistor RMTJ having a low resistance state.

Thus, a current difference between the second current branch BR2 and the third current branch BR3 is larger than that between the first current branch BR1 and the second current branch BR2.

As a result, the second bit line sense amplifier BLSAL is dominant in operation as compared to the first bit line sense amplifier BLSAH. In other words, the first bit line sense amplifier BLSAH is recessive in operation as compared to the second bit line sense amplifier BLSAL.

Thus, a PMOS transistor P5 is relatively slightly turned on as compared to a PMOS transistor P2, and an NMOS transistor N5 is relatively strongly turned on as compared to an NMOS transistor N2. An operation interval T10 in FIG. 5 shows a current variation when a memory cell has data 1. Current levels of IRMTJH and IRMTJ are smaller than that of IRMTJL.

Therefore, a potential of the third output node ON3 gradually decreases to a low level, and a potential of the second output node ON2 is relatively higher than that of the third output node ON3. Meanwhile, a potential of the first output node ON1 has a low level like a potential of the third output node ON3.

As a result, the second sensing voltage VOUTM of the second output node ON2, as shown in the operation interval T10 of FIG. 5, is output as a high level (data 1), and the first and third sensing voltages VOUT and VOUTB of the first and third output nodes ON1 and ON3 are output as a low level (data 0). An operation interval T10 in FIG. 5 shows current and voltage variations when a memory cell has data 1.

As described above, a current sense amplifier circuit shown in FIG. 3 compares a current flowing into a sensing node of a memory cell directly with a current flowing into reference sensing nodes without a current mirroring operation for generation of a sensing reference current.

Figure 6:
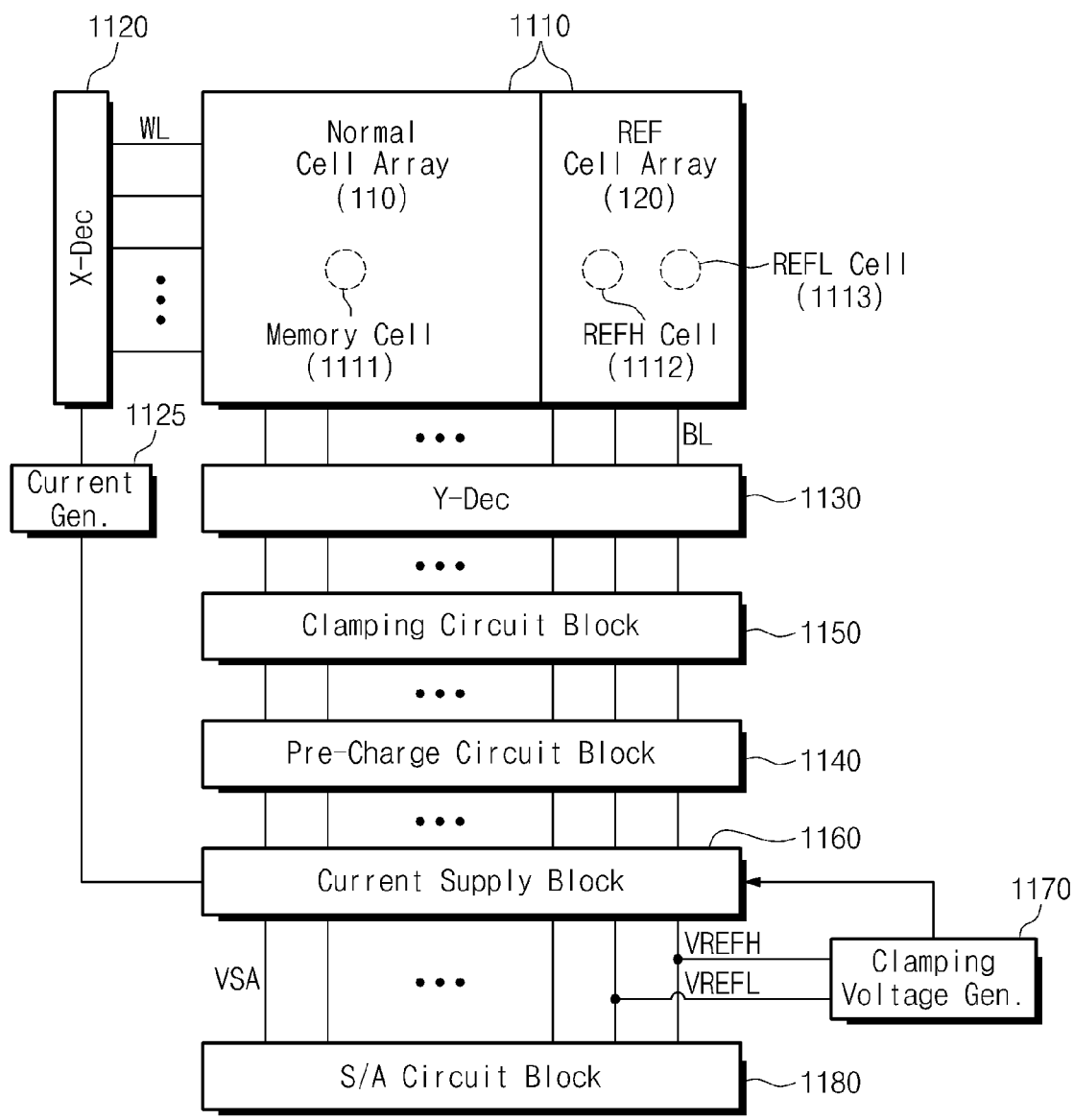
FIG. 6 is a block diagram schematically illustrating a nonvolatile semiconductor memory device including a current sense amplifier circuit shown in FIG. 1.

FIG. 6 is a block diagram schematically illustrating a nonvolatile semiconductor memory device including a current sense amplifier circuit shown in FIG. 1.

A nonvolatile semiconductor memory device 500 includes a memory cell array 1110, a row decoder 1120 for selecting a word line WL of the memory cell array 1110, a column decoder 1130 for selecting a bit line BL of the memory cell array 1110, a pre-charge circuit block 1140 for performing a pre-charge operation on a bit line BL, a clamping circuit block 1150 for clamping a voltage of the bit line BL, a current generating unit 1125 for generating a current to be supplied to a memory cell read circuit, a current supply block 1160 for constantly providing a current generated by the current generating unit 1125 to the bit line BL, a sense amplifier circuit block 1180 for sensing and amplifying a current difference of the bit line BL, and a clamping voltage generating unit 1170 for adjusting a clamping voltage VCMP according to a variation in a cell resistance value of the memory cell array 1110.

The memory cell read circuit includes various circuit components for reading data stored in a memory cell. For example, a current generated by the current generating unit 1125 is provided to a word line or a bit line for a read operation of a memory cell.

The memory cell array 1110 includes a normal memory cell array 110 and a reference cell array 120. The normal memory cell array 110 includes memory cells 1111 formed at intersections of word lines and bit lines. The reference cell array 120 includes reference cells 1112 and 1113 as first and second reference resistors RMTJH and RMTJL.

Here, the reference cells 1112 and 1113 are configured substantially the same as the normal memory cell 1111 storing data. Data corresponding to a logically high level (e.g., data 1) or a logically low level (e.g., data '0') is stored in the reference cells 1112 and 1113. For example, logically low data is written at some cells (e.g., the first reference cell 1113) of the reference cell array 120, and logically high data is written at other cells (e.g., the second reference cell 1112) thereof.

A write operation on the reference cells 1112 and 1113 is performed together at a writ operation on the memory cell 1111. A write operation on the reference cells 1112 and 1113 is performed once, and the first and second reference resistors RMTJH and RMTJL are obtained by iteratively reading the reference cells 1112 and 1113 thus written. In the event that the memory cell 1111 is implemented by an MRAM cell, a value of data stored in the memory cell 1111 or the reference cells 1112 and 1113 is changed by lapse of time. For this reason, a data rewriting operation on the memory cell 1111 is performed periodically. For example, a rewriting operation on the reference cells 1112 and 1113 is performed at the rewriting operation on the memory cell 1111.

The reference cells 1112 and 1113 are disposed to correspond to at least a part of word lines or to correspond to all word lines. When a word line is selected for a data reading or writing operation, data is written at the reference cells 1112 and 1113 connected to the selected word line, or data is read from the reference cells 1112 and 1113 connected to the selected word line to generate a reference current by the first and second reference resistors RMTJH and RMTJL.

In operation, each of the row decoder 1120 and the column decoder 1130 includes MOS transistor based switches. The row decoder 1120 selects word lines WL in response to a row address, and the column decoder 1130 selects bit lines BL in response to a column address. The pre-charge circuit block 1140 pre-charges the bit lines BL with a pre-charge voltage. The clamping circuit block 1150 clamps voltages of the bit lines BL in response to a clamping voltage VCMP from the clamping voltage generating unit 1170. A current generated from the current generating unit 1125 is provided to each read path through the current supply block 1160.

During a data reading operation, voltage levels of the bit lines BL pre-charged are varied according to data values of the memory cells 1111. That is, during the data reading operation, a bit line voltage is developed according to a data value stored in a memory cell.

The memory cell 1111 has a relatively large resistance value or a relatively small resistance value according data written at the memory cell 1111. The amount of current supplied to the sense amplifier circuit block 1180 is variable according to the resistance value of the memory cell 1111. The sense amplifier circuit block 1180 includes sense amplifier circuits shown in FIG. 1. A current difference developed by data stored in the memory cell 1111 is sensed and amplified, and is output as a voltage difference.

Bit lines are additionally disposed to correspond to the reference cell array 120, and a pre-charge operation and a selection operation on a reference cell read path are performed substantially the same or similar to those of a normal memory cell read path. During a data reading operation, the column decoder 1130 selects bit lines connected to the first reference cell 1112 and the second reference cell 1113. Currents of bit lines connected to the first reference cell 1112 and the second reference cell 1113 are developed.

The clamping voltage generating unit 1170 detects variations in first and second reference voltages VREFL and VREFH due to variations in first and second reference currents and adjusts a level of the clamping voltage VCMP. The clamping circuit block 1150 controls a level of a clamping voltage applied to a bit line, based on the clamping voltage VCMP thus adjusted. The sense amplifier circuit block 1180 outputs data by performing an operation of a current sense amplifier shown in FIG. 2 or 3.

Figure 7:
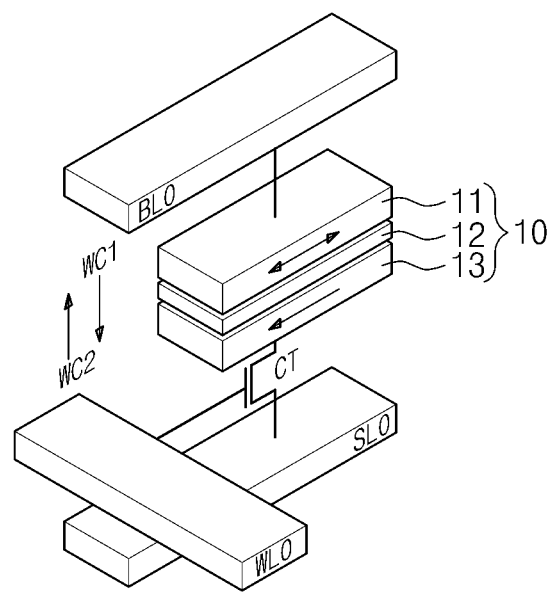
FIG. 7 is a diagram schematically illustrating an STT-MRAM as an example of a memory cell applied to FIG. 6.

FIG. 7 is a diagram schematically illustrating an STT-MRAM as an example of a memory cell applied to FIG. 6.

Referring to FIG. 7 that shows an example of an STT-MRAM (Spin Transfer Torque Magneto Resistive Random Access Memory), a memory cell 1111 includes an MTJ (Magnetic Tunnel Junction) element 10 and a selection transistor CT. A gate of the selection transistor CT is connected to a word line (e.g., a first word line WL0), and one electrode thereof is connected to a bit line (e.g., a first bit line BL0) through the MTJ element 10. Also, the other electrode of the selection transistor CT is connected to a source line (e.g., a first source line SL0).

The MTJ element 10 includes a fixed layer 13, a free layer 11, and a tunnel layer 12 formed between the free layer 11 and the tunnel layer 12. A magnetization direction of the fixed layer 13 is fixed, and a magnetization direction of the free layer 11 is equal or opposite to that of the fixed layer 13. An anti-ferromagnetic layer (not shown) may be further provided to fix a magnetization direction of the fixed layer 13.

A resistance value of the MTJ element 10 is variable according to a magnetization direction of the free layer 11. When a magnetization direction of the free layer 11 is parallel with a magnetization direction of the fixed layer 13, the MTJ element 10 has a low resistance value and stores data 0. When a magnetization direction of the free layer 11 is anti-parallel with a magnetization direction of the fixed layer 13, the MTJ element 10 has a high resistance value and stores data 1. In FIG. 7, the free and fixed layers 11 and 13 of the MTJ element 10 are illustrated as a horizontal magnetic element. However, inventive concepts are not limited thereto. For example, the free and fixed layers 11 and 13 of the MTJ element 10 may be implemented by a vertical magnetic element.

To perform a write operation of the STT-MRAM, a high-level voltage is applied to the word line WL0 to turn the selection transistor CT on. A write current WC1 or WC2 is applied between the bit line BL0 and the source line SL0. A magnetization direction of the free layer 11 is decided according to a direction of the write current WC1 or WC2. For example, when a first write current WC1 is applied, free electrons having the same spin direction as that of the fixed layer 13 force a torque to the free layer 11, so that the free layer 11 is magnetized in the same direction as that of the fixed layer 13.

When a second write current WC2 is applied, electrons having a spin direction opposite to that of the fixed layer 13 return to the free layer 11 to force a torque. At this time, the free layer 11 is magnetized in a direction opposite to that of the fixed layer 13. That is, in the MTJ element 10, a magnetization direction of the free layer 11 is changed by a spin transfer torque (STT).

To perform a read operation of the STT-MRAM, a high-level voltage is applied to the word line WL0 to turn on the selection transistor CT, and a read current is applied in a direction from the bit line BL0 to the source line SL0. Under this bias condition, data stored in the MTJ element 10 is determined. At this time, since a level of the read current is lower than that of the write current WC1 or WC2, a magnetization direction of the free layer 11 is not changed by the read current.

In case of the STT-MRAM where data is written by the spin transfer torque, a difference between a reference voltage for determining data and a data voltage is about 100 mV to 200 mV. A resistance value of the MTJ element is continuously changed by various causes. In the event that a level of a data voltage is varied according to a variation in a resistance value of a memory cell, the reliability on a data read operation is lowered.

In an example embodiment, reference cells are implemented by writing data 1 or data 0 at a normal memory cell configured as illustrated in FIG. 7. Thus, it is unnecessary to fabricate a reference cell separately.

FIGS. 8A to 8E are diagrams showing an MTJ element applied to FIG. 7, according to example embodiments of inventive concepts.

Figure 8A:
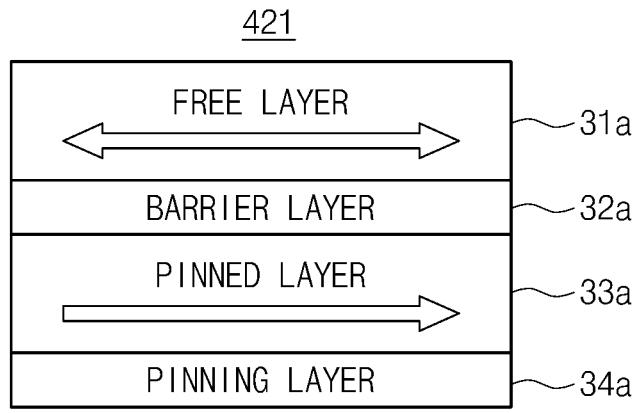
FIGS. 8A to 8E are diagrams showing an MTJ element applied to FIG. 7, according to an example embodiment of inventive concepts.

Referring to FIG. 8A, an MTJ element 421 includes a free layer 31a, a barrier layer 32a, a pinned layer 33a, and a pinning layer 34a. The free layer 31a includes a material having a variable magnetization direction. A magnetization direction of the free layer 31a is changed by electrical/magnetic factors provided from the inside or outside of a memory cell. The free layer 31a includes a ferromagnetic material having at least one of cobalt (Co), iron (Fe), and nickel (Ni). For example, a material of the free layer 31a is one selected from a group of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

A thickness of the barrier layer 32a is less than a spin diffusion distance. The barrier layer 32a includes a non-magnetic material. For example, the barrier layer 32a includes at least one selected from a group of magnesium (Mg) oxide, titanium (Ti) oxide, aluminum (Al) oxide, magnesium-zinc (MgZn) oxide, magnesium-boron (MgB) oxide, titanium (Ti) nitride, and vanadium (V) nitride.

The pinned layer 33a has a magnetization direction fixed by the pinning layer 34a. Also, the pinned layer 33a includes a ferromagnetic material. For example, the pinned layer 33a includes at least one selected from a group of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The pinning layer 34a includes an antiferromagnetic material. For example, the pinning layer 34a includes at least one selected from a group of PtMn, IrMn, MnO, MnS, MnTe, $MnF_2$, $FeCl_2$, FeO, $CoCl_2$, CoO, $NiCl_2$, NiO, and Cr.

According to the above-described MTJ element 421, since the free and pinned layers of the MTJ element 421 are formed of a ferromagnetic material, a stray field arises at an edge of the ferromagnetic material. The stray field causes a decrease in magnetic resistance or an increase in resistance magnetism of the free layer, and affects a switching characteristic to form asymmetric switching. Thus, there is required a technique of reducing or controlling the stray field generated from the ferromagnetic material of the MTJ element 421.

Figure 8B:
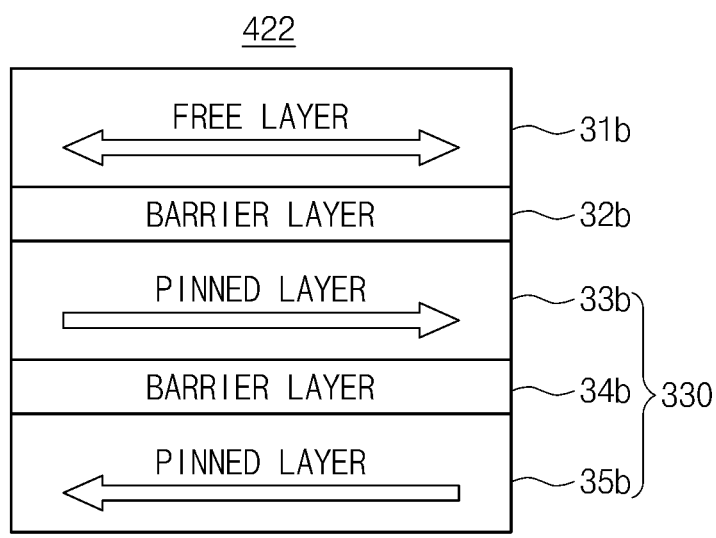

Referring to FIG. 8B, a pinned layer 330 of an MTJ element 422 is implemented by a synthetic antiferromagnetic (SAF) material. The pinned layer 330 includes a first pinned layer 33b, a barrier layer 34b, and a second pinned layer 35b. each of the first and second pinned layers 33b and 35b includes at least one selected from a group of CoFeB, Fe, Co, Ni, Gd, Dy, CoFe, NiFe, MnAs, MnBi, MnSb, CrO2, $MnOFe_2O_3$, $FeOFe_2O_3$, $NiOFe_2O_3$, $CuOFe_2O_3$, $MgOFe_2O_3$, EuO, and $Y_3Fe_5O_{12}$. A magnetization direction of the first pinned layer 33b is different from that of the second pinned layer 35b. The magnetization directions of the first and second pinned layers 33b and 35b are fixed. The barrier layer 34b includes ruthenium (Ru).

Figure 8C:
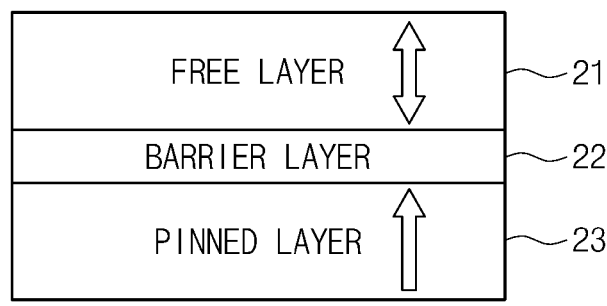

Referring to FIG. 8C, an MTJ element 423 includes a free layer 21, a pinned layer 23, and a barrier layer 22. If a magnetization direction of the free layer 21 is parallel with that of the pinned layer 23, a resistance value is decreased. If a magnetization direction of the free layer 21 is anti-parallel with that of the pinned layer 23, a resistance value is increased. A value of data to be stored is variable according to a resistance value.

To implement an MTJ element 423 the magnetization direction of which is vertical, the free layer 21 and the pinned layer 23 may be desirably formed of a material having large magnetic anisotropy energy. The material having large magnetic anisotropy energy includes amorphous rare earth element alloy, a multi-layer thin film such as (Co/Pt)n or (Fe/Pt)n, and a super-lattice material of L10 crystalline structure. For example, the free layer 21 is formed of an ordered alloy, and includes at least one of iron (Fe), nickel (Ni), palladium (Pd), and platinum (Pt). The free layer 21 includes at least one selected from a group of Fe—Pt alloy, Fe—Pd alloy, Co—Pd alloy, Co—Pt alloy, Fe—Ni—Pt alloy, Co—Fe—Pt alloy, and Co—Ni—Pt alloy, for example. The alloys are expressed by quantitative chemistry and are $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$.

The pinned layer 23 is formed of an ordered alloy, and includes at least one of iron (Fe), cobalt (Co), nickel (Ni), palladium (Pd), and platinum (Pt). For example, the pinned layer 23 includes at least one selected from a group of Fe—Pt alloy, Fe—Pd alloy, Co—Pd alloy, Co—Pt alloy, Fe—Ni—Pt alloy, Co—Fe—Pt alloy, and Co—Ni—Pt alloy. The alloys are expressed by quantitative chemistry and are $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$.

Figure 8D:
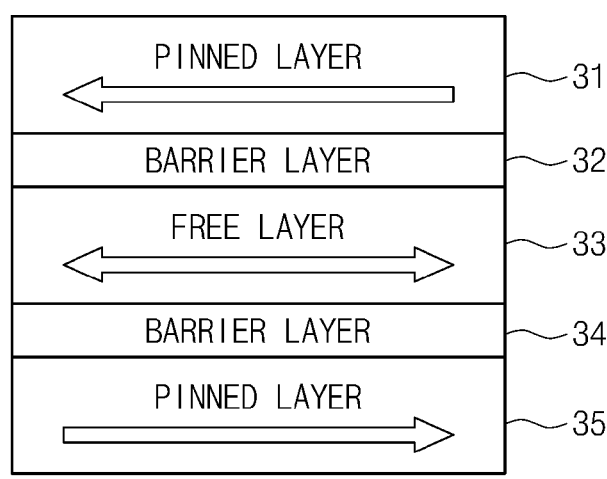
Figure 8E:
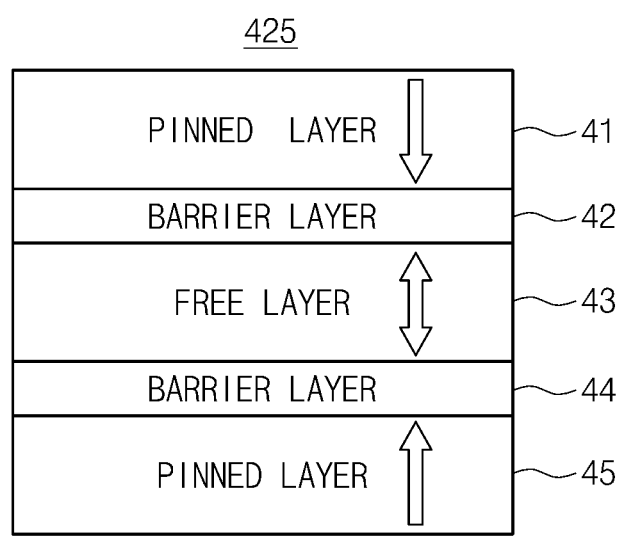

In FIGS. 8D and 8E, there is illustrated a dual MTJ element of an STT-MRAM. A dual MTJ element has such a structure that a barrier layer and a pinned layer are disposed at both ends on the basis of a free layer.

Referring to FIG. 8D, a dual MTJ element 424 forming a horizontal magnetic field includes a first pinned layer 31, a first barrier layer 32, a free layer 33, a second barrier layer 34, and a second pinned layer 35. Materials of layers of the dual MTJ element 424 are equal or similar to those of a free layer 31a, a barrier layer 32a, and a pinned layer 33a shown in FIG. 8A. If a magnetization direction of the first pinned layer 31 is anti-parallel with that of the second pinned layer 35, magnetic forces of the first and second pinned layers 31 and 35 are cancelled out. Thus, the dual MTJ 424 performs a write operation using a current the amount of which is less than that of a conventional MTJ element. Also, since the dual MTJ element 424 provides higher resistance at a read operation due to the second barrier layer 34, it is possible to obtain an accurate data value.

Referring to FIG. 8E, a dual MTJ element 425 forming a vertical magnetic field includes a first pinned layer 41, a first barrier layer 42, a free layer 43, a second barrier layer 44, and a second pinned layer 45. Materials of layers of the dual MTJ element 425 are equal or similar to those of a free layer 21, a barrier layer 22, and a pinned layer 23 shown in FIG. 8C. If a magnetization direction of the first pinned layer 41 is anti-parallel with that of the second pinned layer 45, magnetic forces of the first and second pinned layers 41 and 45 are cancelled out. Thus, the dual MTJ 425 performs a write operation using a current the amount of which is less than that of a conventional MTJ element.

A current sensing operation of a sense amplifier circuit according to inventive concepts is implemented although a memory cell and a reference memory cell are formed by one of MTJ elements shown in FIGS. 8A to 8E.

Figure 9:
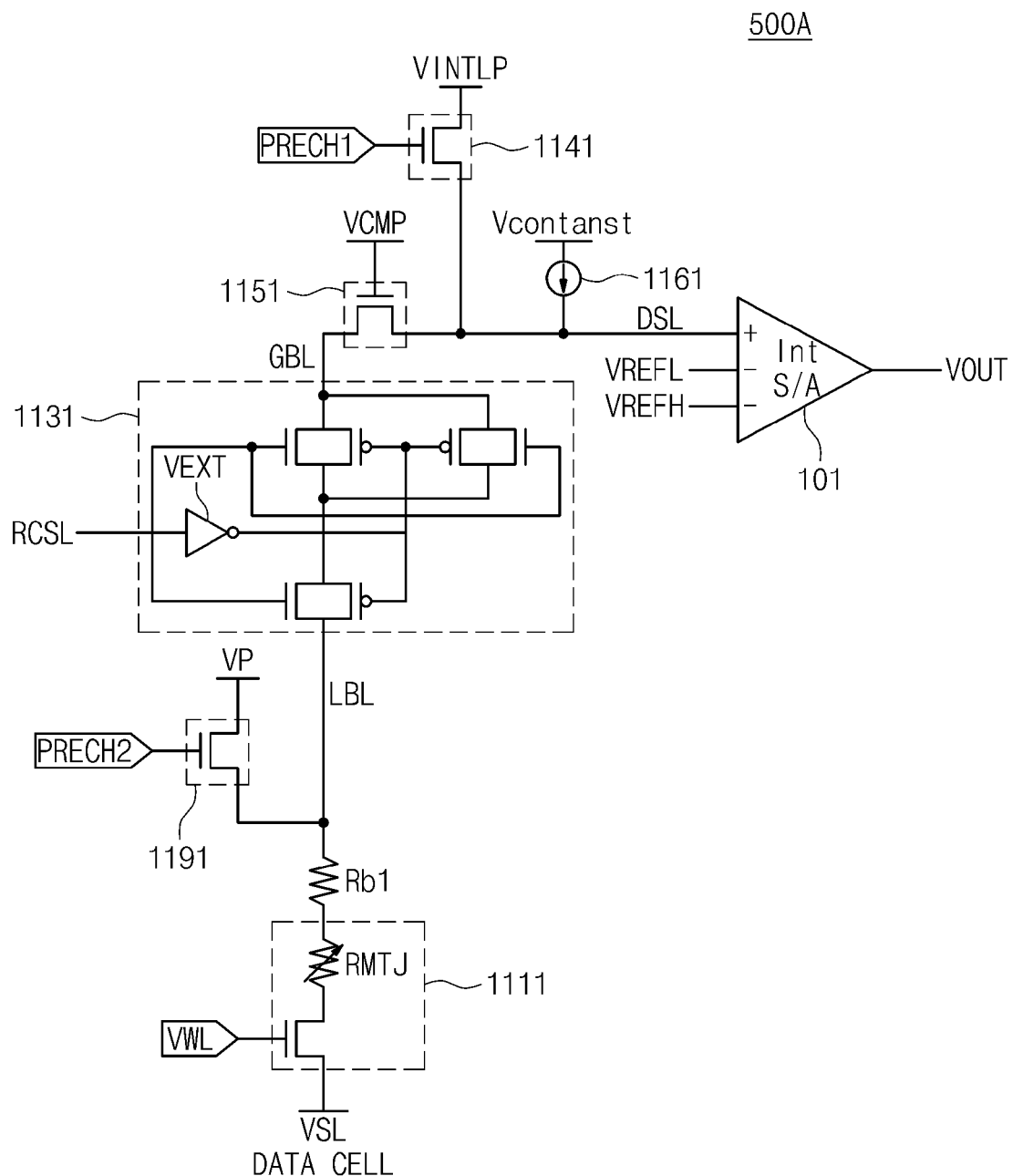
FIG. 9 is a circuit diagram schematically illustrating a data read circuit applied to FIG. 6, according to an example embodiment of inventive concepts.

FIG. 9 is a circuit diagram schematically illustrating a data read circuit applied to FIG. 6, according to an example embodiment of inventive concepts.

A data read circuit 500A is disposed on a data read path, and may include circuits participating in a data read operation. The data read circuit 500A may further include at least a part of components shown in FIG. 6 or components not shown in FIG. 6.

For example, as illustrated in FIG. 9, the data read circuit 500A further include a pre-charge circuit 1191 (hereinafter, referred to as a second pre-charge circuit) in addition to a pre-charge circuit 1141 (hereinafter, referred to as a first pre-charge circuit) shown in FIG. 6. In FIG. 9, there is the data read circuit 500A for reading data of a memory cell 1111. However, a memory device 500 may include a plurality of read circuits for reading data from a plurality of memory cells.

The data read circuit 500A is described with reference to FIGS. 6 and 9.

As illustrated in FIG. 9, the data read circuit 500A is a circuit for reading data stored in the memory cell 1111 and includes the first pre-charge circuit 1141, a bit line selection circuit 1131, a clamping circuit 1151, a current supply circuit 1161, the second pre-charge circuit 1191, and a sense amplifier circuit 101. The sense amplifier circuit 101 is implemented by a current sense amplifier circuit shown in FIG. 1.

The clamping circuit 1151 is formed of a clamping transistor the gate of which is connected to receive a clamping voltage VCMP. A resistor Rb1 is a parasitic resistance component of a bit line.

A bit line described with reference to FIG. 6 is a line for a signal transfer between the memory cell 1111 and the sense amplifier circuit 1181. The bit line may include a local bit line LBL between the memory cell 1111 and the bit line selection circuit 1131, a global bit line GBL between the bit line selection circuit 1131 and the clamping circuit 1151, and a data sensing line DSL between the clamping circuit 1151 and the sense amplifier circuit 1181. Below, an operation of the memory cell read circuit 500A is described with reference to the local bit line LBL, the global bit line GBL, and the data sensing line DSL.

The memory cell 1111 is connected to each local bit line LBL, and a current VSA developed according to data stored in the memory cell 1111 is transferred to the data sensing line DSL. The first pre-charge circuit 1141 for pre-charging the data sensing line DSL with a predetermined level VINTLP (e.g., a pre-charge voltage level) includes a pre-charge circuit 1140 of FIG. 6. The bit line selection circuit 1131 is a circuit that is controlled to be activated or inactivated according to a decoding result of a column address. The bit line selection circuit 1131 may be included in a column decoder 1130 shown in FIG. 6. The clamping circuit 1151 for clamping a current flowing through the data sensing line DSL is disposed to correspond to each read path. The clamping circuit 1151 may be included in a clamping circuit block 1150 shown in FIG. 6. A clamping voltage VCMP applied to a gate of the clamping circuit 1151 is provided from a clamping voltage generation unit 1170 shown in FIG. 6.

The second pre-charge circuit 1191 controls applying of a predetermined level of voltage VP to one node in the data read circuit 500A according to whether the local bit line LBL is selected. For example, the second pre-charge circuit 1191 blocks the voltage VP applied to a selected local bit line LBL and applies the voltage VP to an unselected local bit line LBL. The sense amplifier circuit 101 sense and amplifies a current transferred through the data sensing line DSL. The sense amplifier circuit 101 may be included in a sense amplifier circuit block 1180 shown in FIG. 6. An output VOUT of the sense amplifier circuit 101 is latched by a latch circuit (not shown) and is output as read data.

A data read operation of the data read circuit 500A is as follows. The data sensing line DSL is pre-charged with the predetermined level VINTLP through the first pre-charge circuit 1141 connected to the memory cell 1111. When the bit line selection circuit 1131 is switched by a column address, the local bit line LBL for reading data of the memory cell 1111 is selected. A data current VSA developed according to data stored in the memory cell 1111 is provided to the sense amplifier circuit 101 through the global bit line GBL and the data sensing line DSL. The current supply circuit 1161 provides a current having a constant level to the data sensing line DSL, and the clamping circuit 1151 adjusts the amount of data current VSA in response to the clamping voltage VCMP.

In an MRAM, a resistance value of an MTJ element of the memory cell 1111 is variable according to data stored in the memory cell 1111. The data current VSA is developed according to a resistance value of the MTJ element. A data sensing operation of the current sense amplifier circuit 101 is performed as described with reference to FIG. 2.

An example embodiment of inventive concepts is described using an MRAM. A memory device according to inventive concepts may include resistive memory devices such as a phase change RAM (PRAM), a resistance RAM (RRAM) using a variable resistance material such as complex metal oxide, a magnetic RAM (MRAM) using a ferromagnetic material, a ferroelectric RAM (FRAM) using a ferroelectric capacitor, etc.

Figure 10:
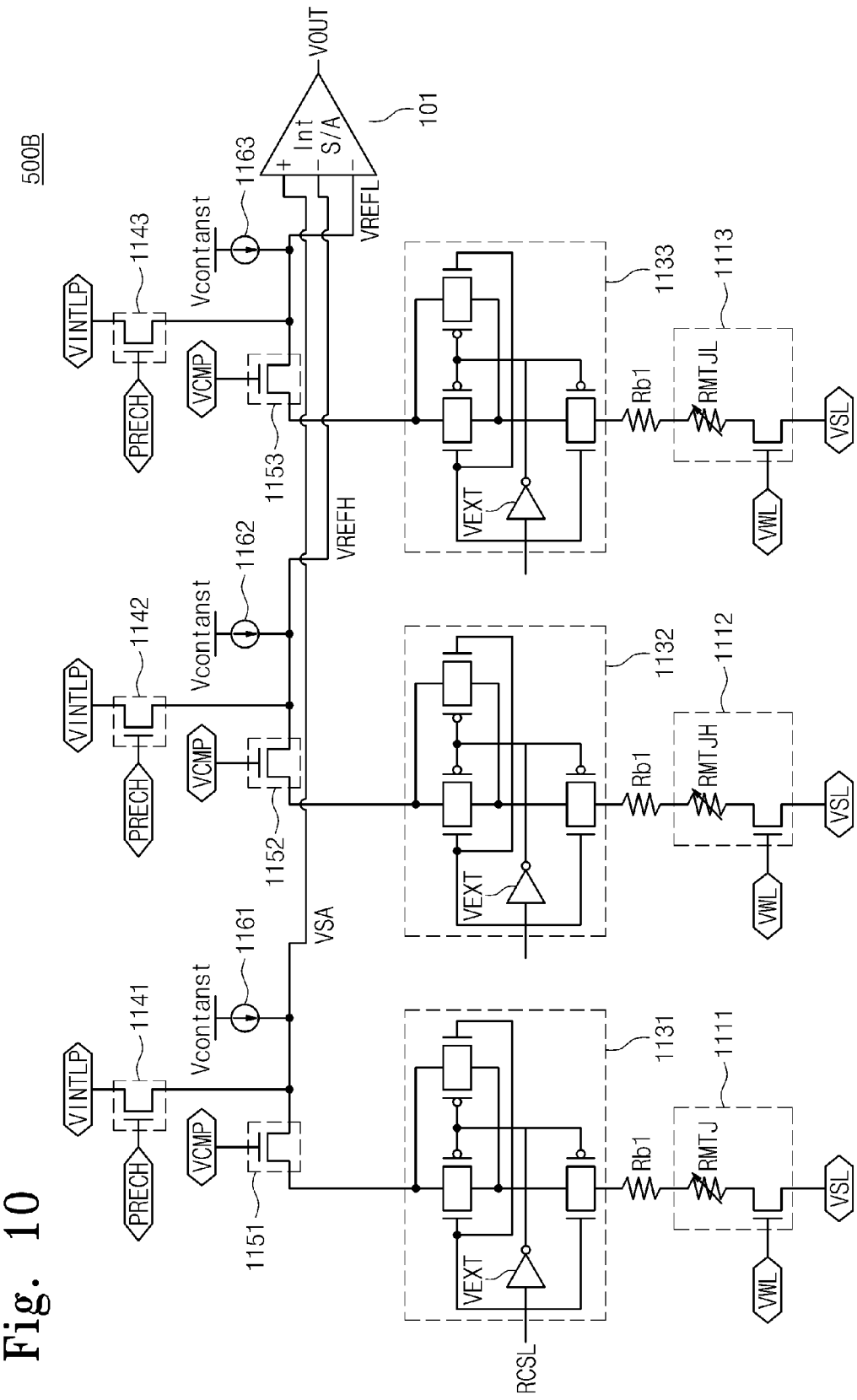
FIG. 10 is a circuit diagram schematically illustrating a data read circuit shown in FIG. 6, according to another example embodiment of inventive concepts.

FIG. 10 is a circuit diagram schematically illustrating a data read circuit shown in FIG. 6, according to another example embodiment of inventive concepts.

Referring to FIG. 10, a data read circuit 500B includes a read path circuit for generating a data current VSA according to data stored in a memory cell 1111, a first reference path circuit for generating a first reference current VREFH, and a second reference path circuit for generating a second reference current VREFL. First and second reference paths VREFH Path and VREFL Path include the same components as those included in a data path VSA Path. As illustrated in FIG. 10, for example, the first reference path circuit includes a pre-charge circuit 1141 connected to a first reference cell 1112, a bit line selection circuit 1132, a clamping circuit 1152, and a current source 1162. Likewise, the second reference path circuit includes a pre-charge circuit 1143 connected to a second reference cell 1113, a bit line selection circuit 1133, a clamping circuit 1153, and a current source 1163. In FIG. 10, there is illustrated an embodiment where current sources 1161 to 1163 are independent. However, a current source may be utilized in common.

A data current VSA is provided to an input terminal (+) of a sense amplifier circuit 101 through a bit line (hereinafter, referred to as a first bit line) connected to a memory cell 1111. First and second reference currents VREFH and VREFL are provided to reference input terminals (−) of the sense amplifier circuit 101 through bit lines (hereinafter, referred to as first and second reference bit lines) respectively connected to first and second reference cells 1112 and 1113. The current sense amplifier circuit 101 generates a data output VOUT based on operations of cross-coupled differential amplifiers covalent bonded as illustrated in FIG. 2.

In accordance with a structure shown in FIG. 10, since a pair of first and second reference cells 1112 and 1113 are disposed to correspond to a plurality of memory cells of a memory cell array 1110, burden on area penalty is reduced. For example, a plurality of memory cells and the first and second reference cells 1112 and 1113 are disposed to correspond to a word line, and a plurality of sense amplifier circuits for sensing data of the memory cells may utilize first and second reference resistance values of the first and second reference cells 1112 and 1113 in common.

Figure 11:
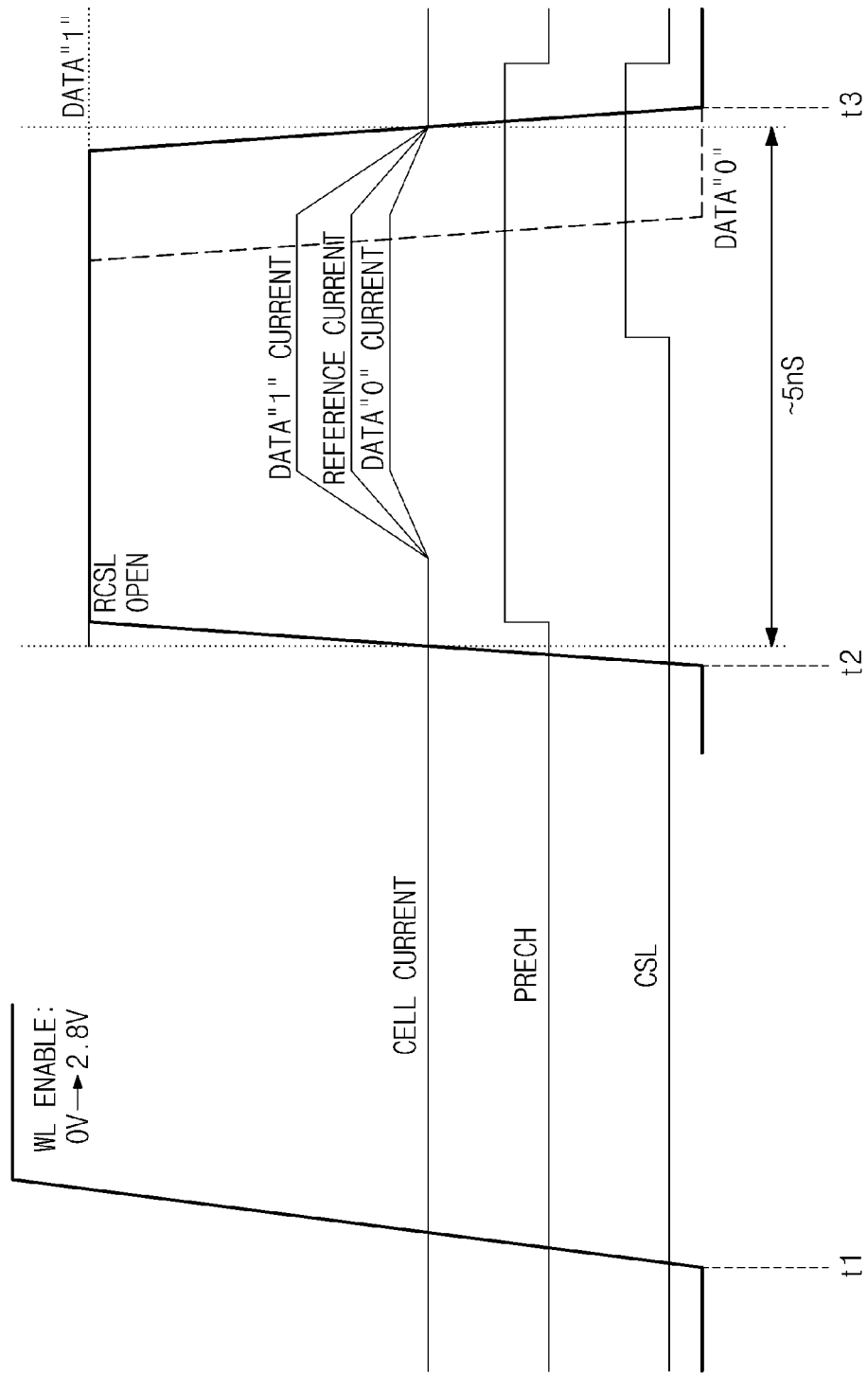
FIG. 11 is an operation timing diagram of a data read operation according to FIG. 10.

FIG. 11 is an operation timing diagram of a data read operation according to FIG. 10.

Referring to FIG. 11, if a word line is enabled, a word line voltage transitions from 0V to 2.8V, and a memory cell is selected to read data. As a read column selection signal RCSL is opened, a '0' current DATA "0" CURRENT or a '1' current DATA '1" CURRENT flows. At the same time, a pre-charge signal PRECH is disabled (high) such that a pre-charge operation is interrupted.

A sensing output signal is amplified by an inherent operation of a current sense amplifier circuit after t2 without a current mirroring operation for generating a reference current and is transferred to an external device in response to an activation of a first column selection signal CSL. In case of an MRAM, the read operation is complemented within 5 ns.

FIGS. 12A to 12D are diagrams showing applications of the inventive concepts applied to a memory system having various interfaces.

Figure 12A:
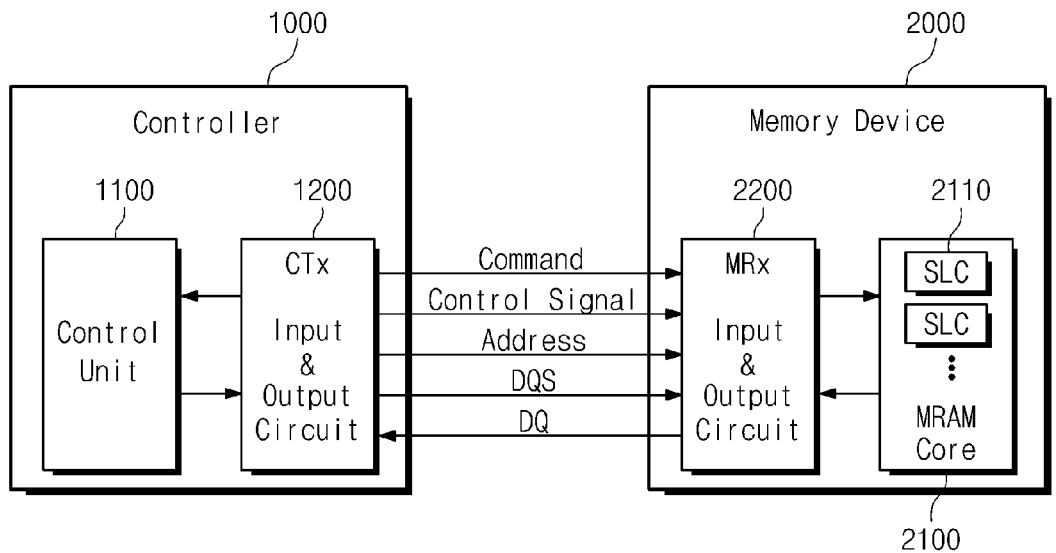
FIGS. 12A to 12D are diagrams showing applications of inventive concepts applied to a memory system having various interfaces.

Referring to FIG. 12A, a memory system includes a controller 1000 and a memory device 2000. The controller 1000 includes a control unit 1100 and an input and output circuit 1200. The memory device 2000 includes an MRAM core 2100 having a sensing and latch circuit 2110 and an input and output circuit 2200. The input and output circuit 1200 of the controller 1000 may include an interface that sends a command, a control signal, an address, and a data strobe signal DQS to the memory device 2000 and receives and sends data DQ.

Figure 12B:
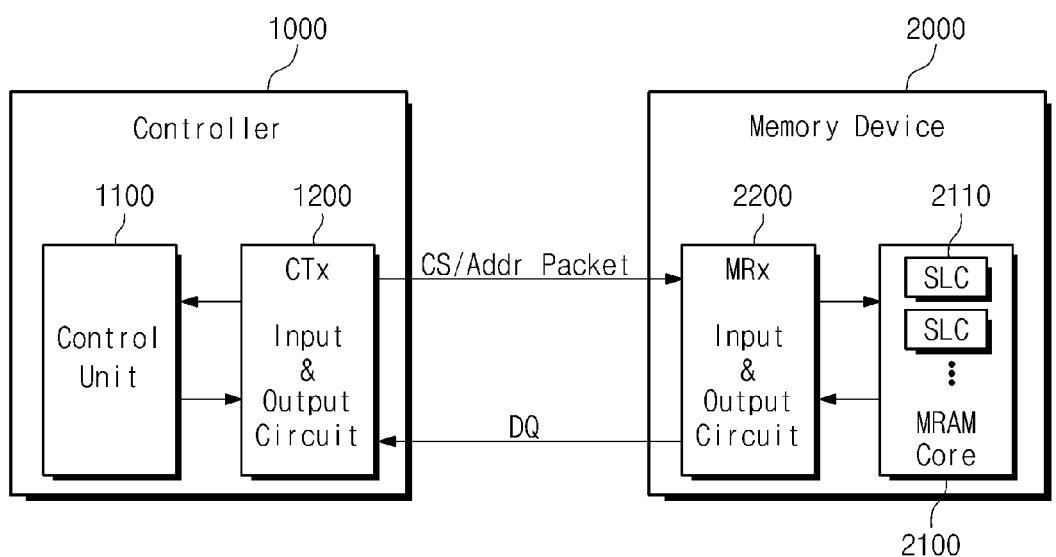

Referring to FIG. 12B, the input and output circuit 1200 of the controller 1000 may include an interface that sends a packet including a chip selection signal CS and an address and transmits and receives data DQ.

Figure 12C:
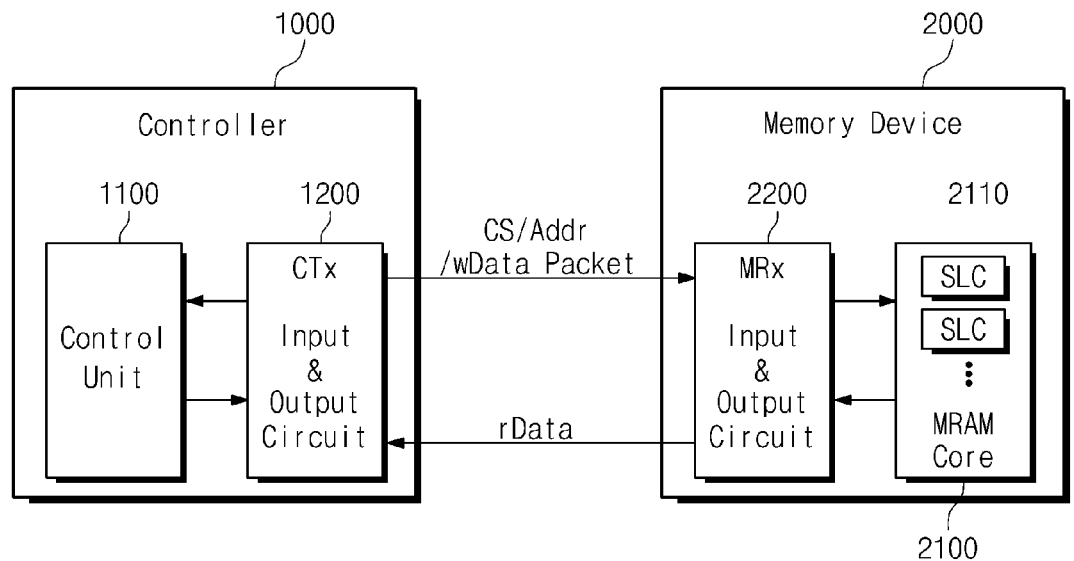

Referring to FIG. 12C, the input and output circuit 1200 of the controller 1000 may include an interface that sends a packet including a chip selection signal CS, an address and write data wData and receives read data rData.

Figure 12D:
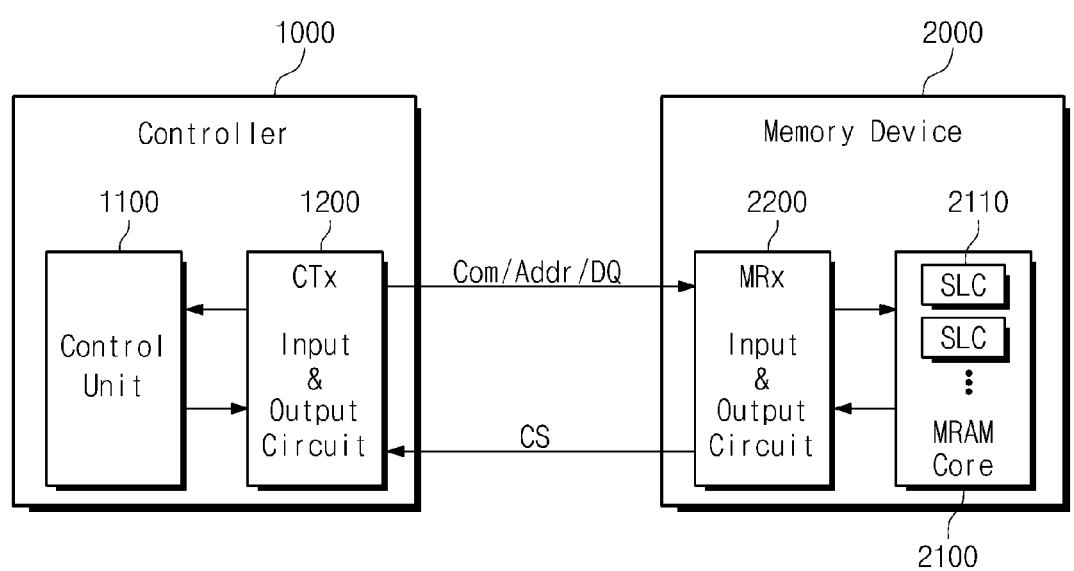

Referring to FIG. 12D, the input and output circuit 1200 of the controller 1000 may include an interface that transmits and receives a command, an address, and data DQ and receives a chip selection signal CS.

Figure 13:
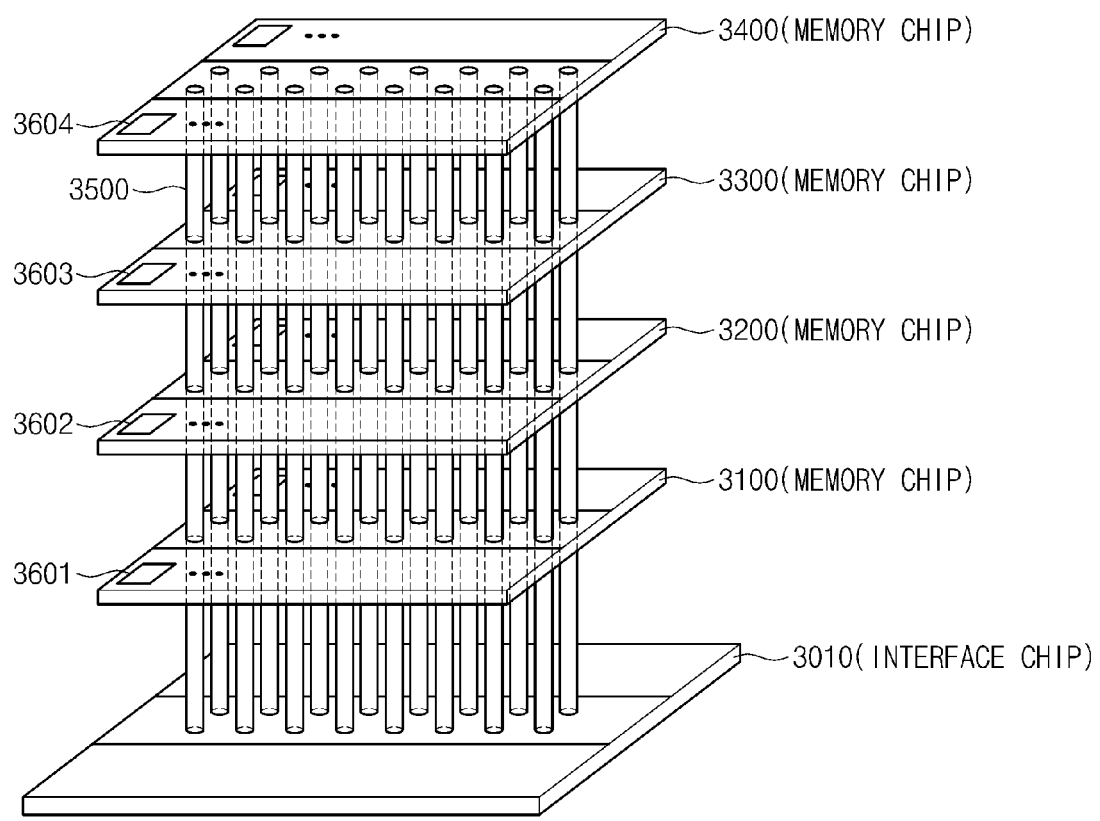
FIG. 13 is a diagram schematically illustrating an application of inventive concepts applied to a memory system stacked through through-silicon via (TSV)

FIG. 13 is a diagram schematically illustrating an application of inventive concepts applied to a memory system stacked through through-silicon via (TSV).

Referring to FIG. 13, an interface chip 3010 is placed at the lowermost layer, and memory chips 3100, 3200, 3300, and 3400 are placed on the interface chip 3010. The memory chips 3100, 3200, 3300, and 3400 include sensing and latch circuits 3601, 3602, 3603, and 3604, respectively. Adjacent chips are connected through micro bumps 3500, and a chip itself is connected through through-silicon via (TSV). For example, the number of chips stacked is 1 or more.

Figure 14:
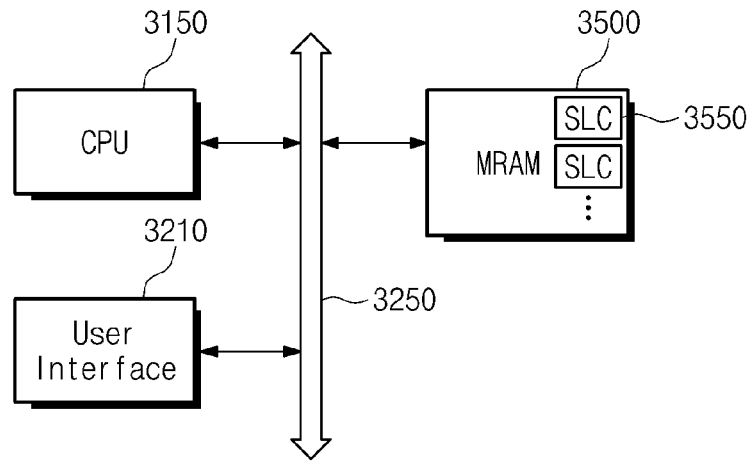
FIG. 14 is a diagram showing an application of inventive concepts applied to an electronic system.

FIG. 14 is a diagram showing an application of inventive concepts applied to an electronic system.

Referring to FIG. 14, an MRAM 3500 including a data read circuit 3550 of the inventive concept, a central processing unit (CPU) 3150, and a user interface 3210 are connected to a system bus 3250.

In the event that an electronic system is a portable electronic device, a separate interface may be connected with an external communication device. The communication device may be a DVD player, a computer, a set top box (STB), a game machine, a digital camcorder, or the like.

Although not shown in FIG. 14, the portable electronic device may further include an application chipset, a camera image processor (CIS), a mobile DRAM, and so on.

An MRAM (3500) chip and a CPU (3150) chip may be packed independently or using various packages. For example, a chip may be packed by a package such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

In FIG. 14, a flash memory may be further connected to the bus 3250. However, a variety of nonvolatile storages may be used.

The nonvolatile storage may store data information having various data formats such as a text, a graphic, a software code, and so on.

The nonvolatile storage may be formed of EEPROM (Electrically Erasable Programmable Read-Only Memory), flash memory, MRAM (Magnetic RAM), STT-MRAM (Spin-Transfer Torque MRAM), CBRAM (Conductive bridging RAM), FeRAM (Ferroelectric RAM), PRAM (Phase change RAM) called OUM (Ovonic Unified Memory), RRAM or ReRAM (Resistive RAM), nanotube RRAM, PoRAM (Polymer RAM), NFGM (Nano Floating Gate Memory), holographic memory, molecular electronics memory device), or insulator resistance change memory.

Figure 15:
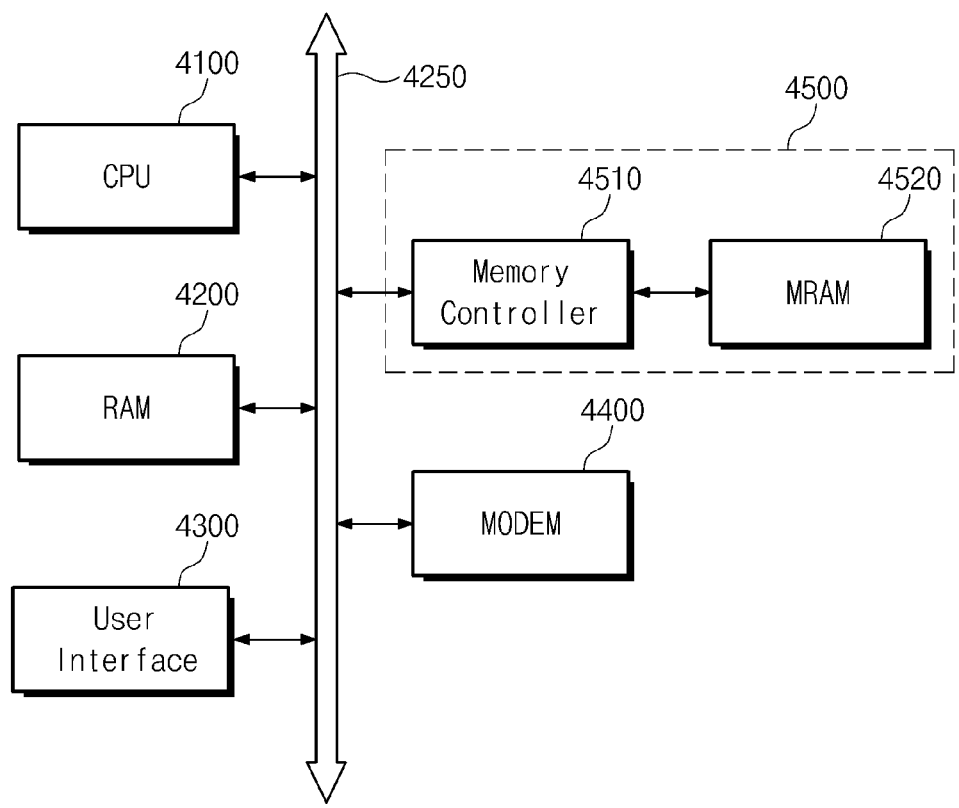
FIG. 15 is a block diagram schematically illustrating an application of inventive concepts applied to a computing device.

FIG. 15 is a block diagram schematically illustrating an application of inventive concepts applied to a computing device.

Referring to FIG. 15, a computing device includes a memory system 4500 including an MRAM 4520 and a memory controller 4510. The computing device may include an information processing device or a computer. For example, the computing device includes the memory system 4500, a MODEM 4250, a CPU 4100, a RAM 4200, and a user interface 4300 that are electrically connected to a system bus 4250. Data processed by the CPU 4100 or data input from an external device may be stored in the memory system 4500.

The computing device may further comprise a solid state disk, a camera image sensor, an application chipset, and so on. For example, the memory system 4500 may be formed of a solid state drive (SSD). In this case, the computing device may store mass data at the memory system 4500 stably and reliably.

The MRAM 4520 of the memory system 4500 may be configured such that a data read circuit includes a current sense amplifier circuit shown in FIG. 1. Thus, the performance of the computing device is improved.

The memory controller 4510 sends a command, an address, data, and control signals to the MRAM 4520.

The CPU 4100 functions as a host and controls an overall operation of the computing device.

A host interface between the CPU 4100 and the memory controller 4510 may include a variety of protocols for data exchange between the memory controller 4510 and a host. The memory controller 4510 is configured to communicate with the host or an external device using at least one of various protocols such as USB (Universal Serial Bus) protocol, MMC (multimedia card) protocol, PCI (peripheral component interconnection) protocol, PCI-E (PCI-express) protocol, ATA (Advanced Technology Attachment) protocol, Serial-ATA protocol, Parallel-ATA protocol, SCSI (small computer small interface) protocol, ESDI (enhanced small disk interface) protocol, and IDE (Integrated Drive Electronics) protocol.

As another example, the device shown in FIG. 15 may be provided as one of various components of an electronic device such as a computer, a ultra-mobile personal computer (UMPC), a workstation, a net-book, a personal digital assistance (PDA), a portable computer (PC), a web tablet, a wireless phone, a mobile phone, a smart phone, a smart television, a three-dimensional television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information in a wireless environment, one of various electronic devices constituting a home network, one of various electronic devices constituting a computer network, one of various electronic devices constituting a telematics network, a radio frequency identification (RFID) device, and one of various components constituting a computing system.

Figure 16:
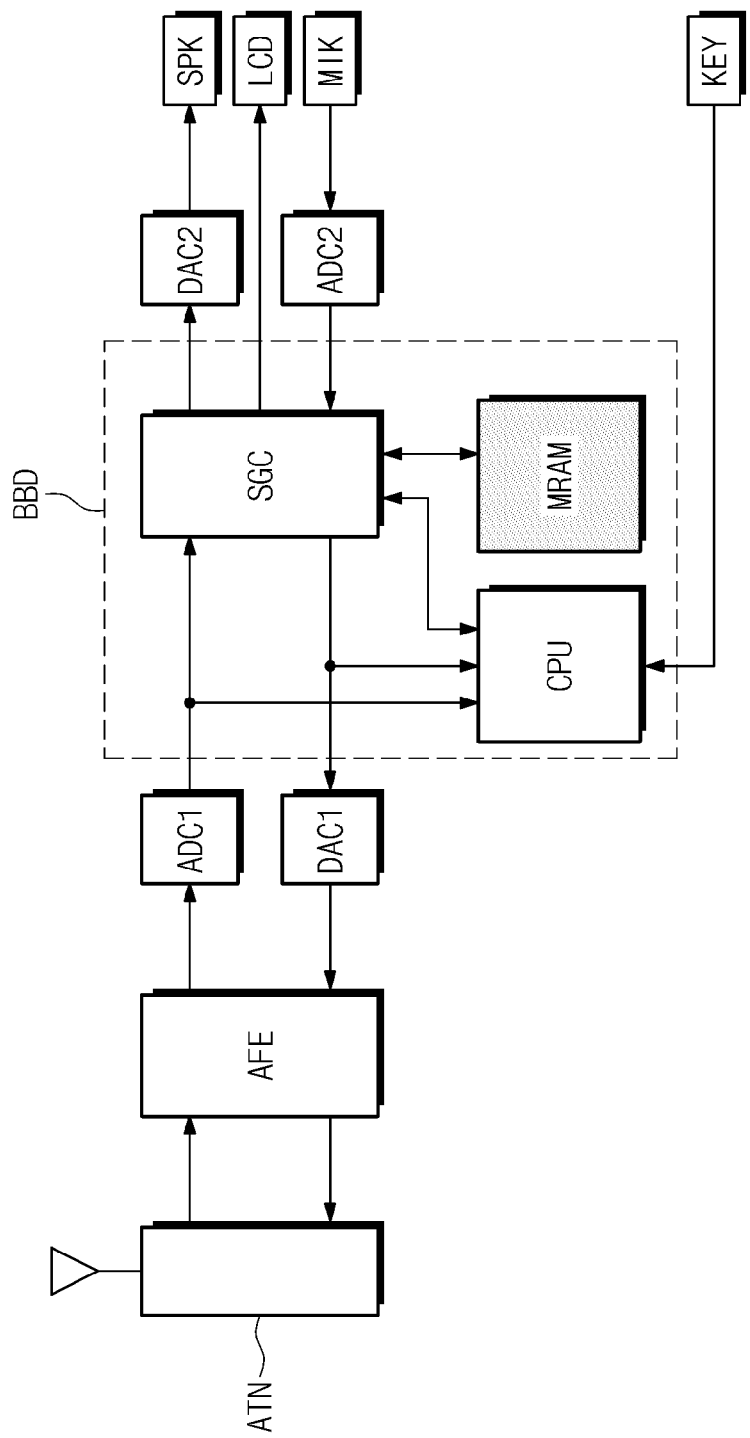
FIG. 16 is a block diagram schematically illustrating an application of inventive concepts applied to a portable telephone.

FIG. 16 is a block diagram schematically illustrating an application of inventive concepts applied to a portable telephone.

Referring to FIG. 16, there are illustrated main blocks of a portable telephone (e.g., a smart phone) including an MRAM. The portable telephone includes an antenna ATN, an analog front end block AFE, analog-to-digital converters ADC1 and ADC2, digital-to-analog converters DAC1 and DAC2, a baseband block BBD, a speaker SPK, a liquid crystal monitor LCD, a microphone MIK, and an input key KEY. Although not shown in FIG. 16, the analog front end block AFE may be a well-known circuit block that is formed of an antenna switch, a band pass filter, various amplifiers, a power amplifier, a phase locked loop, a voltage controlled oscillator, an orthogonal demodulator, an orthogonal modulator, etc. and transmits and receives radio waves. The baseband block BBD includes a signal processing circuit SGC, a central processing unit CPU, and an MRAM including a current sense amplifier circuit according to the inventive concept.

Below, an operation of the portable telephone is described with reference to FIG. 16. When an image including voice and character information is received, a radio wave input from the antenna ATN is provided to the analog-to-digital converter ADC1 through the analog front end block AFE for waveform equalization and analog-to-digital conversion. An output signal of the analog-to-digital converter ADC1 is provided to the signal processing circuit SGC of the baseband block BBD for voice and image processing. A voice signal is transferred to the speaker SPK through the digital-to-analog converter DAC2, and an image signal is transferred to the liquid crystal monitor. In the event that a voice signal is transmitted, a signal input through the microphone MIK is provided to the signal processing circuit SGC through the analog-to-digital converter ADC2 for voice processing. An output of the signal processing circuit SGC is transferred to the antenna ATN through the digital-to-analog converter DAC1 and the analog front end block AFE. In the event that character information is transmitted, a signal input from the input key KEY is provided to the antenna ATN through the baseband block BBD, the digital-to-analog converter DAC1 and the analog front end block AFE.

In the baseband block BBD, the MRAM according to the inventive concept, the central processing unit CPU, and the signal processing circuit SGC are connected bi-directionally. Here, the central processing unit CPU executes a control in the baseband block BBD or a control of a peripheral block (not shown) according to a signal from the input key KEY, an output of the analog-to-digital converter ADC1, and an output of the signal processing circuit SGC. For example, the central processing unit CPU writes or reads information (e.g., dial numbers, abbreviated numbers, etc.) in or from the MRAM of the inventive concept. As another example, the central processing unit CPU controls the signal processing circuit SGC according to an output signal of the signal processing circuit SGC and an output signal of the analog-to-digital converter ADC1, and writes or reads a program for signal processing in or from the MRAM of the inventive concept. The MRAM of inventive concepts may be used as a buffer that temporarily stores image signals provided from the signal processing circuit SGC and outputs the temporarily stored image signals to the liquid crystal monitor.

The number of parts of the portable telephone system is reduced by applying the MRAM of inventive concepts to a programmable ROM using a flash memory and main, cache and image memories using an SRAM. Also, it is possible to implement a light and small portable telephone. The MRAM of inventive concepts has an excellent margin of a sensing operation and reference cells are implemented by normal memory cells. Thus, the performance of the portable telephone is improved.

Another application of the MRAM of inventive concepts is a system LSI where a plurality of components in a circuit block shown in FIG. 16 and the MRAM of inventive concepts are formed on a chip. For example, parts become more light and smaller by mounting a system LSI where the baseband block BBD is formed on a chip, on the portable telephone. Also, since a data processing speed is improved by the system LSI, a processing capacity of the portable telephone is improved.

A still another embodiment is a memory card including the MRAM of the inventive concept. The MRAM, as described above, is a nonvolatile memory, and the number of write and read operations of the MRAM is not limited. A writing time of the MRAM is shorter than 10 ns. This writing time is faster than that of a flash memory. By the MRAM of the inventive concept, it is possible to implement a mass storage memory card that is speedy and reliable on high integration and has an excellent environmental resistance property.

While inventive concepts have been described with reference to example embodiments, it will be apparent to those skilled in the art that various changes and modifications may be made without departing from the spirit and scope of example embodiments. Therefore, it should be understood that example embodiments described herein are not limiting, but illustrative.

For example, changes or modification on a sense amplifier may be made by changing circuit components of drawings or adding or subtracting components without departing from the spirit and scope of inventive concepts. Also, inventive concepts are mainly described using a memory system including an MRAM. However, inventive concepts are applicable to other semiconductor memory devices that sense a current difference without a current mirroring operation.

What is claimed is:

1. A current sense amplifier circuit of a semiconductor memory device, comprising:
  a first cross coupled differential amplifier connected to a first sensing node and to a second sensing node, the first sensing node connected to a first reference resistor and the second sensing node connected to a memory cell, the first cross coupled differential amplifier configured to output a first sensing voltage to a first output terminal; and
  a second cross coupled differential amplifier connected to the second sensing node and to a third sensing node, the third sensing node connected to a second reference resistor different from the first reference resistor,
  wherein the second cross coupled differential amplifier and the first cross coupled differential amplifier are commonly connected to the second sensing node, the first and second cross coupled differential amplifiers cooperatively configured to output a second sensing voltage to a second output terminal, the first and second sensing voltages being differential, and
  the second cross coupled differential amplifier is configured to output a third sensing voltage equal to the first sensing voltage to a third output terminal.

2. The current sense amplifier circuit of claim 1, wherein the first and second cross coupled differential amplifiers include PMOS transistors and NMOS transistors.

3. The current sense amplifier circuit of claim 1, wherein the first and second cross coupled differential amplifiers include PMOS transistors having the same size and NMOS transistors having the same size.

4. The current sense amplifier circuit of claim 1, wherein first and second reference cells include the first and second reference resistors, respectively, and the first and second reference cells are a same type as the memory cell.

5. The current sense amplifier circuit of claim 4, wherein the first reference resistor has a first resistance value corresponding to the memory cell having a first resistance state and the second reference resistor has a second resistance value corresponding to the memory cell having a second resistance state, the second resistance state different from the first resistance state.

6. The current sense amplifier circuit of claim 1, wherein the current sense amplifier circuit is configured to generate a sensing reference current based on a current flowing to the second sensing node and currents flowing to the first and third sensing nodes without a current mirroring operation.

7. The current sense amplifier circuit of claim 1, wherein the memory cell is an STT-MRAM cell including an access transistor and an MTJ element.

8. A nonvolatile memory device, comprising:
  a memory cell array including magnetic memory cells and first and second reference memory cells, the first and second reference cells including first and second reference resistors, respectively; and
  a read and write circuit including a sense amplifier circuit configured to sense data stored in the magnetic memory cells,
  wherein the sense amplifier circuit includes a current sense amplifier circuit including a first cross coupled differential amplifier connected to a first sensing node and a second sensing node, the first sensing node connected to the first reference resistor and the second sensing node connected to a selected magnetic memory cell of the magnetic memory cells, the first cross coupled differential amplifier configured to output a first sensing voltage to a first output terminal, and
  a second cross coupled differential amplifier connected to the second sensing node and to a third sensing node, the third sensing node connected to the second reference resistor,
  wherein the second cross coupled differential and the first cross coupled differential amplifier are commonly connected to the second sensing node, the first and second cross coupled differential amplifiers cooperatively configured to output a second sensing voltage to a second output terminal, the first and second sensing voltages being differential, and the second cross coupled differential amplifier is configured to output a third sensing voltage equal to the first sensing voltage to a third output terminal.

9. The nonvolatile memory device of claim of 8, wherein a resistance value of the first reference memory cell is equal to a resistance value of the selected magnetic memory cell having a first resistance state.

10. The nonvolatile memory device of claim of 9, wherein a resistance value of the second reference memory cell is equal to a resistance value of the selected magnetic memory cell having a second resistance state.

11. The nonvolatile memory device of claim of 10, wherein the first resistance state of the selected magnetic memory cell corresponds to data '1'.

12. The nonvolatile memory device of claim of 11, wherein the second resistance state of the selected magnetic memory cell corresponds to data '0'.

13. The nonvolatile memory device of claim of 12, wherein the selected magnetic memory cell and the first and second reference memory cells each include an STT-MRAM cell, the first reference memory cell has a high resistance state, and the second reference memory cell has a low resistance state.

14. A nonvolatile memory device comprising:
a current sense amplifier coupled to a memory cell, the memory cell coupled to a sensing node, the current sense amplifier including,
a first cross coupled differential amplifier coupled to a first reference cell, and
a second cross coupled differential amplifier coupled to a second reference cell, the first and second differential amplifiers being coupled in common to the sensing node and coupled in common to an output terminal, the current sense amplifier configured to determine a state of the memory cell based on states of the first and second reference cells, respectively.

15. The nonvolatile memory device of claim 14, wherein the current sense amplifier is configured to determine the state of the memory cell without current mirroring.

16. The nonvolatile memory device of claim 14, wherein the first reference cell has a first resistance and the second reference cell has a second resistance, the first and second resistances being different.

17. The nonvolatile memory device of claim 16, wherein the first resistance represents a first state and the second resistance represents a second state, the memory cell having one of the first and second states.

18. The nonvolatile memory device of claim 14, wherein the first and second cross coupled differential amplifiers are covalently bonded.

19. The nonvolatile memory device of claim 14, wherein the first reference cell, the second reference cell and the memory cell are a same type.

* * * * *